(12) United States Patent
Suzuki et al.

(10) Patent No.: US 11,676,672 B2
(45) Date of Patent: Jun. 13, 2023

(54) SEMICONDUCTOR STORAGE DEVICE CONFIGURED TO PERFORM A DETECTION OPERATION AFTER PERFORMING A PROGRAM LOOP

(71) Applicant: KIOXIA CORPORATION, Tokyo (JP)

(72) Inventors: Shinji Suzuki, Sagamihara Kanagawa (JP); Yasuhiro Shimura, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 125 days.

(21) Appl. No.: 17/011,747

(22) Filed: Sep. 3, 2020

(65) Prior Publication Data

US 2021/0193239 A1    Jun. 24, 2021

(30) Foreign Application Priority Data

Dec. 24, 2019  (JP) .............................. JP2019-232943

(51) Int. Cl.
*G11C 16/34*    (2006.01)
*G11C 16/30*    (2006.01)
*G11C 16/26*    (2006.01)
*G11C 16/10*    (2006.01)

(52) U.S. Cl.
CPC .......... *G11C 16/3459* (2013.01); *G11C 16/10* (2013.01); *G11C 16/26* (2013.01); *G11C 16/30* (2013.01); *G11C 16/3404* (2013.01)

(58) Field of Classification Search
CPC ..... G11C 16/3459; G11C 16/10; G11C 16/26; G11C 16/30; G11C 16/3404; G11C 16/34; G11C 16/3436; G11C 16/0483
See application file for complete search history.

(56) References Cited

U.S. PATENT DOCUMENTS

| 9,691,486 | B2 | 6/2017 | Kim |
| 9,761,318 | B1 | 9/2017 | Kondo |
| 2015/0146489 | A1 | 5/2015 | Lee et al. |
| 2017/0206978 | A1* | 7/2017 | Joo .......................... G11C 16/10 |
| 2018/0240515 | A1* | 8/2018 | Shibata .................. G11C 16/32 |

* cited by examiner

*Primary Examiner* — Alfredo Bermudez Lozada
(74) *Attorney, Agent, or Firm* — Kim & Stewart LLP

(57) ABSTRACT

A semiconductor storage device includes memory cells a controller performing a write operation on the memory cells. The write operation includes program loops with a program operation and a verification operation. In a first loop the controller applies a first program voltage and a first verification voltage. Next, a detection operation counts the memory cells with a threshold voltage above a first threshold value. In a second program loop, after the detection operation, the controller applies a second program voltage and a second verification voltage. The values of used for second program voltage and the second verification voltage are set dependent on the counted number of memory cells with a threshold voltage above the first threshold value.

20 Claims, 19 Drawing Sheets

CHANGE IN THRESHOLD VOLTAGE DISTRIBUTION DUE TO FIRST PROGRAM LOOP
(USES SAME PROGRAM VOLTAGE VPGMinit)

(1) CELL WEAR: LOW (2) CELL WEAR: MIDDLE (3) CELL WEAR: HIGH

CHANGE IN THRESHOLD VOLTAGE DISTRIBUTION DUE TO WRITE OPERATION (CELL WEAR: LOW)

(1) AFTER FIRST PROGRAM LOOP (2) AFTER SECOND PROGRAM LOOP (3) AFTER THIRD PROGRAM LOOP (4) AFTER FOURTH PROGRAM LOOP

WRITE OPERATION ACCORDING TO FIRST MODIFICATION EXAMPLE (CELL WEAR: HIGH)

WRITE OPERATION ACCORDING TO SECOND MODIFICATION EXAMPLE (CELL WEAR: HIGH)

WRITE OPERATION ACCORDING TO THIRD MODIFICATION EXAMPLE (CELL WEAR: HIGH)

WRITE OPERATION ACCORDING TO FOURTH MODIFICATION EXAMPLE (CELL WEAR: HIGH)

THRESHOLD VOLTAGE DISTRIBUTION ACCORDING TO FIFTH MODIFICATION EXAMPLE (CELL WEAR: HIGH)

SEMICONDUCTOR STORAGE DEVICE CONFIGURED TO PERFORM A DETECTION OPERATION AFTER PERFORMING A PROGRAM LOOP

CROSS-REFERENCE TO RELATED APPLICATION

This application is based upon and claims the benefit of priority from Japanese Patent Application No. 2019-232943, filed Dec. 24, 2019, the entire contents of which are incorporated here by reference.

FIELD

Embodiments described herein relate generally to a semiconductor storage device.

BACKGROUND

A NAND flash memory capable of storing data in a nonvolatile manner is known.

DETAILED DESCRIPTION

Figure 1:
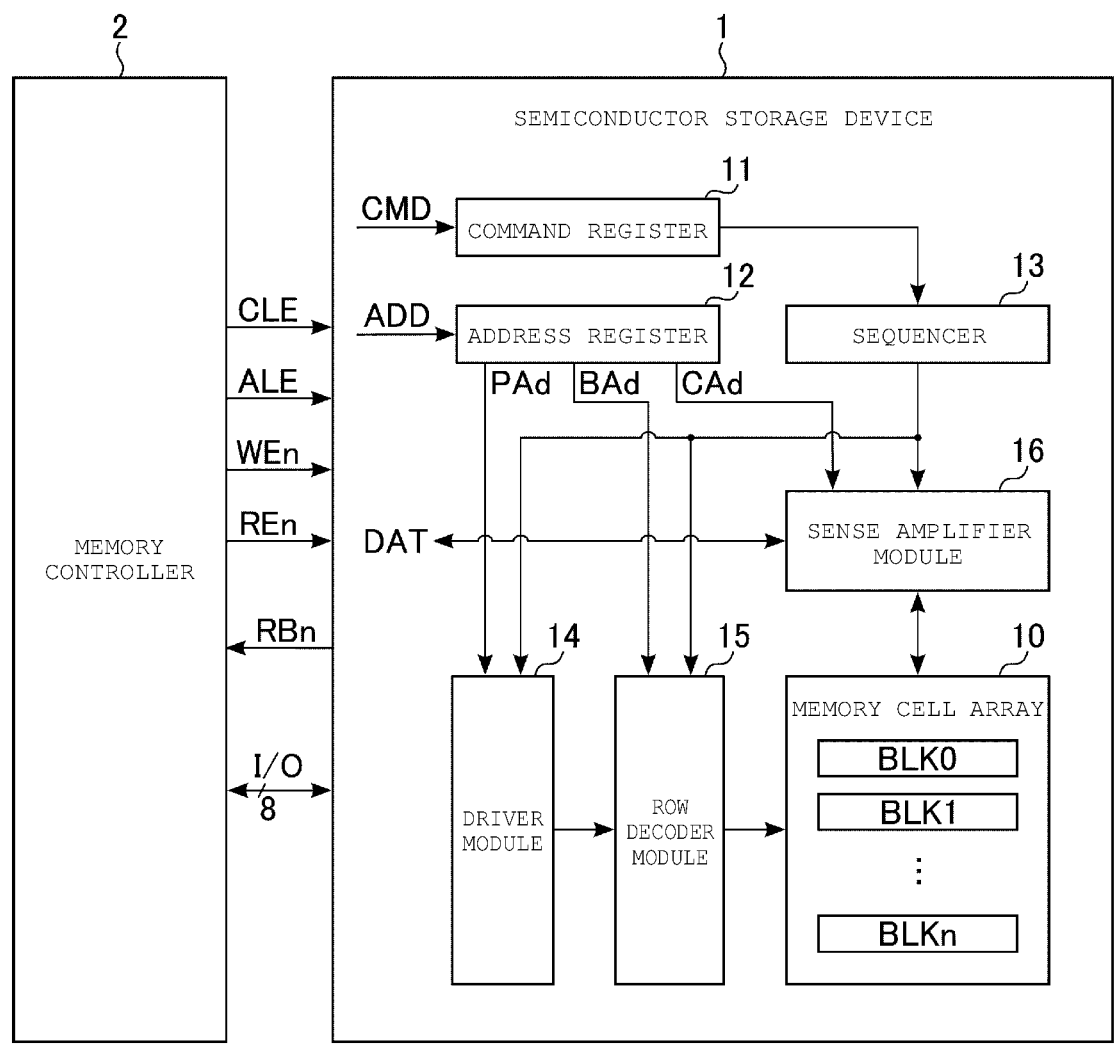
FIG. 1 is a block diagram of a semiconductor storage device according to a first embodiment.

In general, according to one embodiment, a semiconductor storage device includes a plurality of memory cells and a controller configured to perform a write operation on the plurality of memory cells. The write operation includes a plurality of program loops. Each program loop includes a program operation and a verification operation. After a first program loop in which the controller applies a first program voltage to the plurality of memory cells in the program operation and a first verification voltage to the plurality of memory cells in the verification operation, the controller performs a detection operation to count the number of memory cells in the plurality of memory cells with a threshold voltage above a first threshold value. In a second program loop, after the detection operation, the controller applies a second program voltage to the plurality of memory cells in the program operation and a second verification voltage to the plurality of memory cells in the verification operation. The second program voltage is set to a first program value when the counted number of memory cells with a threshold voltage above the first threshold value is greater than a predetermined number and a to second program value when the counted number is less than or equal to the predetermined number. The first program value is less than the second program value. The second verification voltage is a first verification value when the counted number of memory cells is greater than the predetermined number and a second verification value when the counted number of memory cells is less than or equal to the predetermined number. The first verification value is greater than the second verification value.

Hereinafter, certain example embodiments will be described with reference to the drawings. These example embodiments each exemplify a device or a method incorporating at least one technical concept of the present disclosure. The drawings are schematic and/or conceptual, and, as such, depicted dimensions, proportions, and the like in each drawing are not always the same as actual ones. The present disclosure is not limited by particular details of the disclosed elements of the example embodiments.

In the following description, elements having substantially the same function and configuration are designated by the same reference numerals. Numerals after letters that are a part of reference signs are referenced by reference signs including the same letters and used to distinguish between elements having a similar configuration. If it is not necessary to distinguish elements indicated by reference numerals including the same letter from each other, the elements will be referenced by reference numerals each including only letters.

1. Embodiments

A semiconductor storage device 1 according to a first embodiment will be described below.

1-1. Configuration of Semiconductor Storage Device 1

1-1-1. Overall Configuration of Semiconductor Storage Device 1

FIG. 1 illustrates a configuration example of the semiconductor storage device 1 according to the first embodiment. The semiconductor storage device 1 is a NAND flash memory capable of storing data in a nonvolatile manner and can be controlled by an external memory controller 2. As illustrated in FIG. 1, the semiconductor storage device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer of 1 or more). The blocks BLK include a set of a plurality of memory cells capable of storing data in a nonvolatile manner. The blocks BLK are used as a data erasure unit. The memory cell array 10 is provided with a plurality of bit lines and a plurality of word lines. Each memory cell is associated with, for example, one bit line and one word line.

The command register 11 stores a command CMD that the semiconductor storage device 1 receives from the memory controller 2. The command CMD includes, for example, an instruction that causes the sequencer 13 to perform a read operation, a write operation, an erase operation, and the like.

The address register 12 stores address information ADD that the semiconductor storage device 1 receives from the memory controller 2. The address information ADD includes, for example, a block address BAd, a page address PAd, and a column address CAd. For example, the block address BAd, the page address PAd, and the column address CAd are used to select the block BLK, the word line, and the bit line, respectively.

The sequencer 13 controls an overall operation of the semiconductor storage device 1. For example, the sequencer 13 controls the driver module 14, the row decoder module 15, the sense amplifier module 16, and the like to perform a read operation, a write operation, an erase operation, and the like based on the command CMD stored in the command register 11.

The driver module 14 generates voltages used for a read operation, a write operation, an erase operation, and the like.

Then, the driver module 14 applies a generated voltage to a signal line corresponding to the selected word line based on, for example, the page address PAd stored in the address register 12.

The row decoder module 15 selects one block BLK in the corresponding memory cell array 10 based on the block address BAd stored in the address register 12. Then, the row decoder module 15 transfers, for example, a voltage applied to the signal line corresponding to the selected word line to the selected word line in the selected block BLK.

In the write operation, the sense amplifier module 16 applies a desired voltage to each bit line according to the write data DAT received from the memory controller 2. In the read operation, the sense amplifier module 16 determines data stored in the memory cell based on a voltage of a bit line and transfers a determination result to the memory controller 2 as the read data DAT.

Communication between the semiconductor storage device 1 and the memory controller 2 supports, for example, a NAND interface standard. For example, in the communication between the semiconductor storage device 1 and the memory controller 2, a command latch enable signal CLE, an address latch enable signal ALE, a write enable signal WEn, a read enable signal REn, a ready busy signal RBn, and an input/output signal I/O.

The command latch enable signal CLE indicates that the input/output signal I/O received by the semiconductor storage device 1 is the command CMD. The address latch enable signal ALE indicates that the input/output signal I/O received by the semiconductor storage device 1 is the address information ADD. The write enable signal WEn instructs the semiconductor storage device 1 to input the input/output signal I/O. The read enable signal REn instructs the semiconductor storage device 1 to output the input/output signal I/O. The ready/busy signal RBn notifies the memory controller 2 whether the semiconductor storage device 1 is in a ready state or a busy state. The ready state is a state in which the semiconductor storage device 1 accepts an instruction, and the busy state is a state in which the semiconductor storage device 1 does not accept an instruction. The input/output signal I/O is a signal having, for example, a width of 8 bits and may include the command CMD, the address information ADD, the data DAT, and the like.

The semiconductor storage device 1 and the memory controller 2 described above may be combined into one semiconductor device by their combination. The semiconductor device includes, for example, a memory card such as an SD™ card and a solid state drive (SSD).

1-1-2. Circuit Configuration of Semiconductor Storage Device 1 Regarding Circuit Configuration of Memory Cell Array 10

Figure 2:
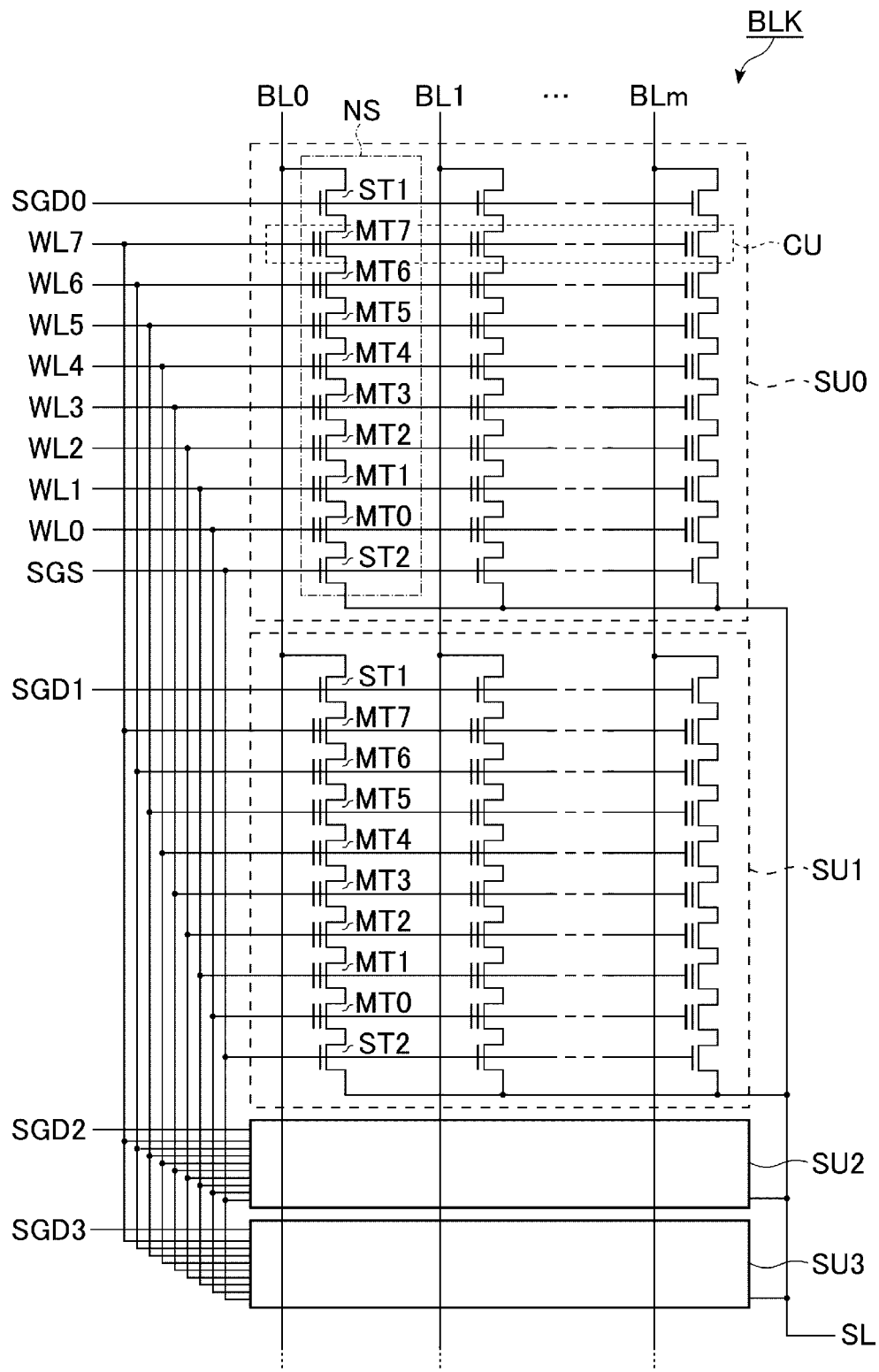
FIG. 2 is a circuit diagram of a memory cell array in a semiconductor storage device according to a first embodiment.

FIG. 2 illustrates an example of a circuit configuration of the memory cell array 10 in the semiconductor storage device 1 according to the first embodiment, which illustrates one block BLK extracted from the plurality of blocks BLK in the memory cell array 10. As illustrated in FIG. 2, the block BLK includes, for example, four string units SU0 to SU3.

Each string unit SU includes a plurality of NAND strings NS respectively associated with the bit lines BL0 to BLm (m is an integer of 1 or more). Each NAND string NS includes, for example, memory cell transistors MT0 to MT7 and select transistors ST1 and ST2. The memory cell transistor MT includes a control gate and a charge storage layer and stores data in a nonvolatile manner. Each of the select transistors ST1 and ST2 is used to select the string unit SU in various operations.

In each NAND string NS, the memory cell transistors MT0 to MT7 are connected to each other in series. A drain of the select transistor ST1 is connected to the associated bit line BL, and a source of the select transistor ST1 is connected to one end of the memory cell transistors MT0 to MT7 connected to each other in series. A drain of the select transistor ST2 is connected to the other end of the memory cell transistors MT0 to MT7 connected to each other in series. A source of the select transistor ST2 is connected to a source line SL.

In the same block BLK, control gates of the memory cell transistors MT0 to MT7 are respectively connected to the word lines WL0 to WL7. Gates of the select transistors ST1 in the string units SU0 to SU3 are respectively connected to the select gate lines SGD0 to SGD3. Gate of the select transistors ST2 in the same block BLK are connected in common to one select gate line SGS.

In the circuit configuration of the memory cell array 10 described above, a bit line BL is shared by the NAND strings NS to which the same column address is assigned in each string unit SU. The source line SL is shared by, for example, the plurality of blocks BLK.

A set of memory cell transistors MT connected to the same word line WL in one string unit SU is called, for example, a cell unit CU. For example, storage capacity of the cell unit CU including memory cell transistors MT that each store 1-bit data is defined as "1-page data" or one page. The cell unit CU may have the storage capacity of two pages of data or more depending on the number of bits of data that can be stored in each memory cell transistor MT.

The circuit configuration of the memory cell array 10 in the semiconductor storage device 1 according to the present disclosure is not limited to the configuration described above. For example, the number of string units SU in each block BLK and the numbers of memory cell transistors MT and select transistors ST1 and ST2 in each NAND string NS may be freely selected.

Regarding Circuit Configuration of the Row Decoder Module

Figure 3:
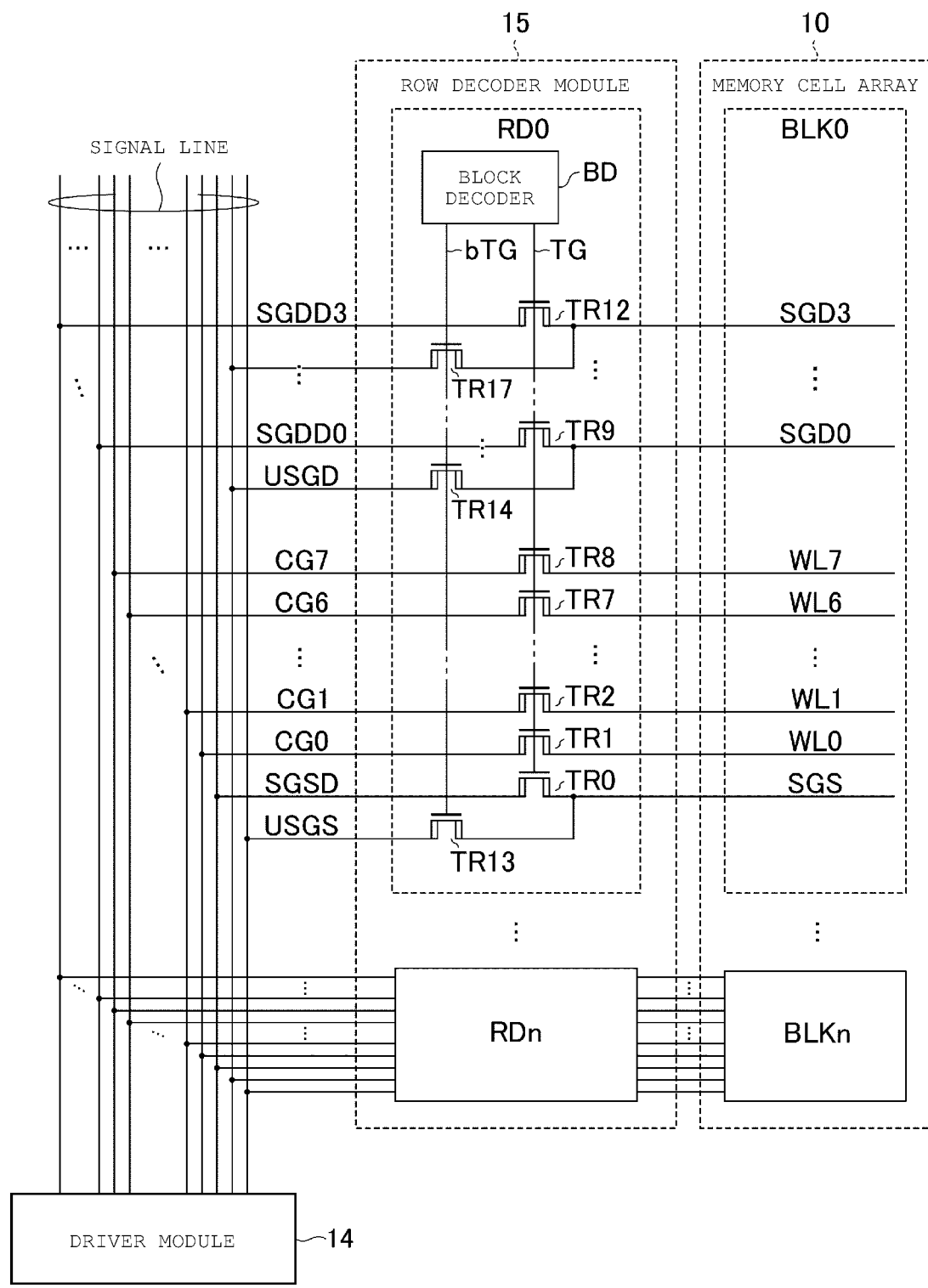
FIG. 3 is a circuit diagram of a row decoder module in a semiconductor storage device according to a first embodiment.

FIG. 3 illustrates an example of a circuit configuration of the row decoder module 15 in the semiconductor storage device 1 according to the first embodiment. As illustrated in FIG. 3, the row decoder module 15 includes, for example, row decoders RD0 to RDn and is connected to the driver module 14 via signal lines CGO to CG7, SGDD0 to SGDD3, SGSD, USGD, and USGS.

Hereinafter, a detailed circuit configuration of the row decoder RD will be described by focusing on the row decoder RD0 corresponding to the block BLK0. The row decoder RD includes, for example, a block decoder BD, transmission gate lines TG and bTG, and transistors TR0 to TR17.

The block decoder BD decodes the block address BAd. Then, the block decoder BD applies a predetermined voltage to each of the transmission gate lines TG and bTG based on a decoding result. A voltage applied to the transmission gate line TG and a voltage applied to the transmission gate line bTG have a complementary relationship. In other words, an inverted signal of the transmission gate line TG is input to the transmission gate line bTG.

Each of the transistors TR0 to TR17 is a high breakdown voltage N-type MOS transistor. Gates of the transistors TR0 to TR12 are connected in common to the transmission gate line TG. Gates of the transistors TR13 to TR17 are connected in common to the transmission gate line bTG. Each transistor TR is connected between a signal line from the driver module 14 and a wire provided in the corresponding block BLK.

Specifically, a drain of the transistor TR0 is connected to the signal line SGSD. A source of the transistor TR0 is connected to the select gate line SGS. Drains of the transistors TR1 to TR8 are connected to the signal lines CGO to CG7, respectively. Sources of the transistors TR1 to TR8 are connected to the word lines WL0 to WL7, respectively. Drains of the transistors TR9 to TR12 are connected to the signal lines SGDD0 to SGDD3, respectively. Sources of the transistors TR9 to TR12 are connected to the select gate lines SGD0 to SGD3, respectively. A drain of the transistor TR13 is connected to the signal line USGS. A source of the transistor TR13 is connected to the select gate line SGS. Drains of the transistors TR14 to TR17 are connected in common to the signal line USGD. Sources of the transistors TR14 to TR17 are connected to the select gate lines SGD0 to SGD3, respectively.

That is, the signal lines CGO to CG7 are used as global word lines shared by the plurality of blocks BLK, and the word lines WL0 to WL7 are used as local word lines provided for each block. The signal lines SGDD0 to SGDD3 and SGSD are used as global transmission gate lines shared between the plurality of blocks BLK, and the select gate lines SGD0 to SGD3 and SGS are used as local transmission gate lines provided separately for each block.

With the above configuration, the row decoder module 15 can select the block BLK. Specifically, in various operations, the block decoder BD corresponding to the selected block BLK applies voltages of "H" level and "L" level to the transmission gate lines TG and bTG, respectively, and the block decoder BD corresponding to the unselected block BLK applies voltages of "L" level and "H" level to the transmission gate lines TG and bTG, respectively.

The circuit configuration of the row decoder module 15 described above is merely an example and may be changed as appropriate. For example, the number of transistors TR in the row decoder module 15 is designed based on the number of wires provided in each block BLK.

Regarding Circuit Configuration of Sense Amplifier Module 16

Figure 4:
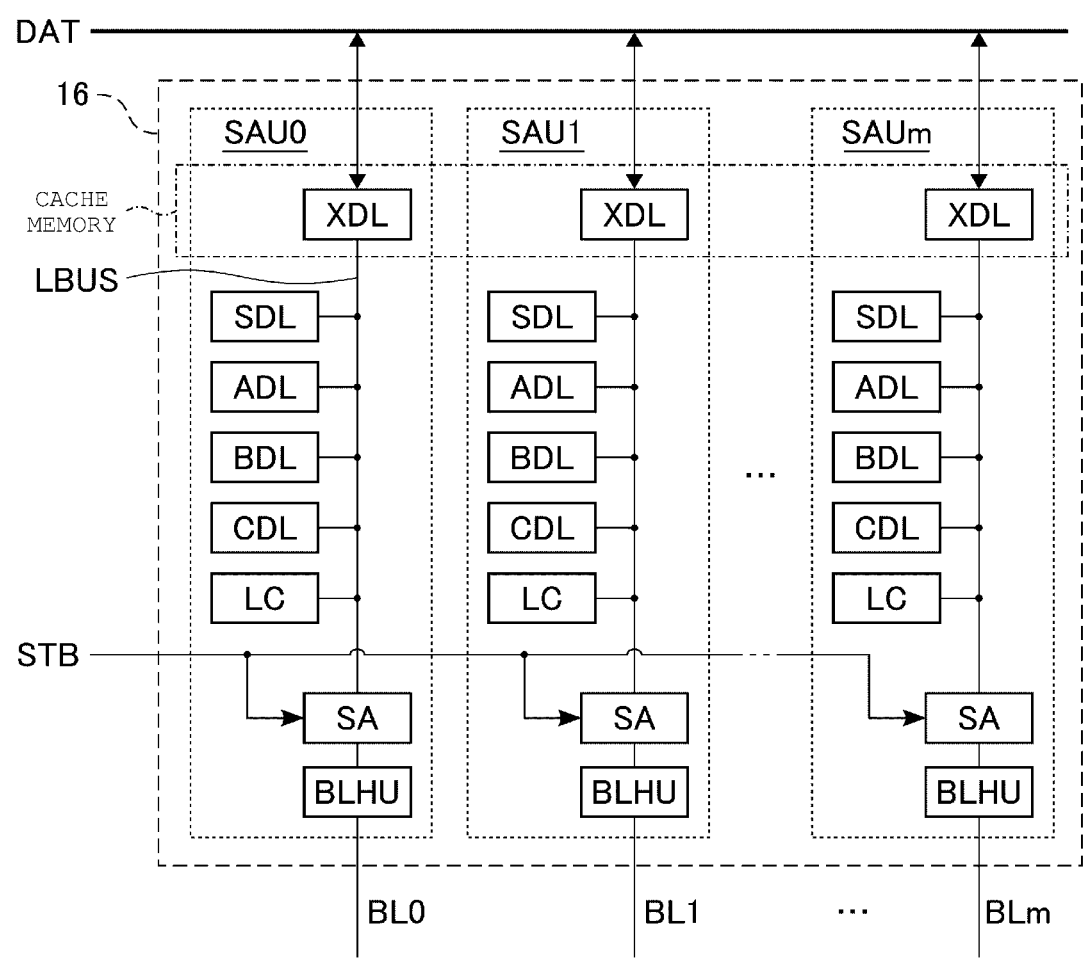
FIG. 4 is a circuit diagram of a sense amplifier module in a semiconductor storage device according to a first embodiment.

FIG. 4 illustrates an example of a circuit configuration of the sense amplifier module 16 in the semiconductor storage device 1 according to the first embodiment. As illustrated in FIG. 4, each sense amplifier unit SAU includes, for example, a bit line connection unit BLHU, a sense amplifier unit SA, a logic circuit LC, and latch circuits SDL, ADL, BDL, CDL, and XDL.

The bit line connection unit BLHU includes a high breakdown voltage transistor connected between the associated bit line BL and the sense amplifier unit SA. The sense amplifier unit SA, the logic circuit LC, and the latch circuits SDL, ADL, BDL, CDL, and XDL are connected to a bus LBUS. The latch circuits SDL, ADL, BDL, CDL, and XDL can transmit and receive data to and from each other.

For example, a control signal STB generated by the sequencer 13 is input to each sense amplifier unit SA. Then, the sense amplifier unit SA determines whether the data read to the associated bit line BL is "0" or "1" based on timing when the control signal STB is asserted. That is, the sense amplifier unit SA determines data stored in the selected memory cell based on a voltage of the bit line BL.

The logic circuit LC performs various logic operations by using the data stored in the latch circuits SDL, ADL, BDL, CDL, and XDL connected to the common bus LBUS.

Specifically, the logic circuit LC can perform an AND operation, an OR operation, a NAND operation, a NOR operation, an EXNOR operation, and the like by using the data stored in the two latch circuits.

Each of the latch circuits SDL, ADL, BDL, CDL, and XDL temporarily stores data. The latch circuit XDL is used for input/output of the data DAT between an input/output circuit of the semiconductor storage device 1 and the sense amplifier unit SAU. The latch circuit XDL may also be used as, for example, a cache memory of the semiconductor storage device 1. The semiconductor storage device 1 can be in a ready state if at least the latch circuit XDL is empty.

Figure 5:
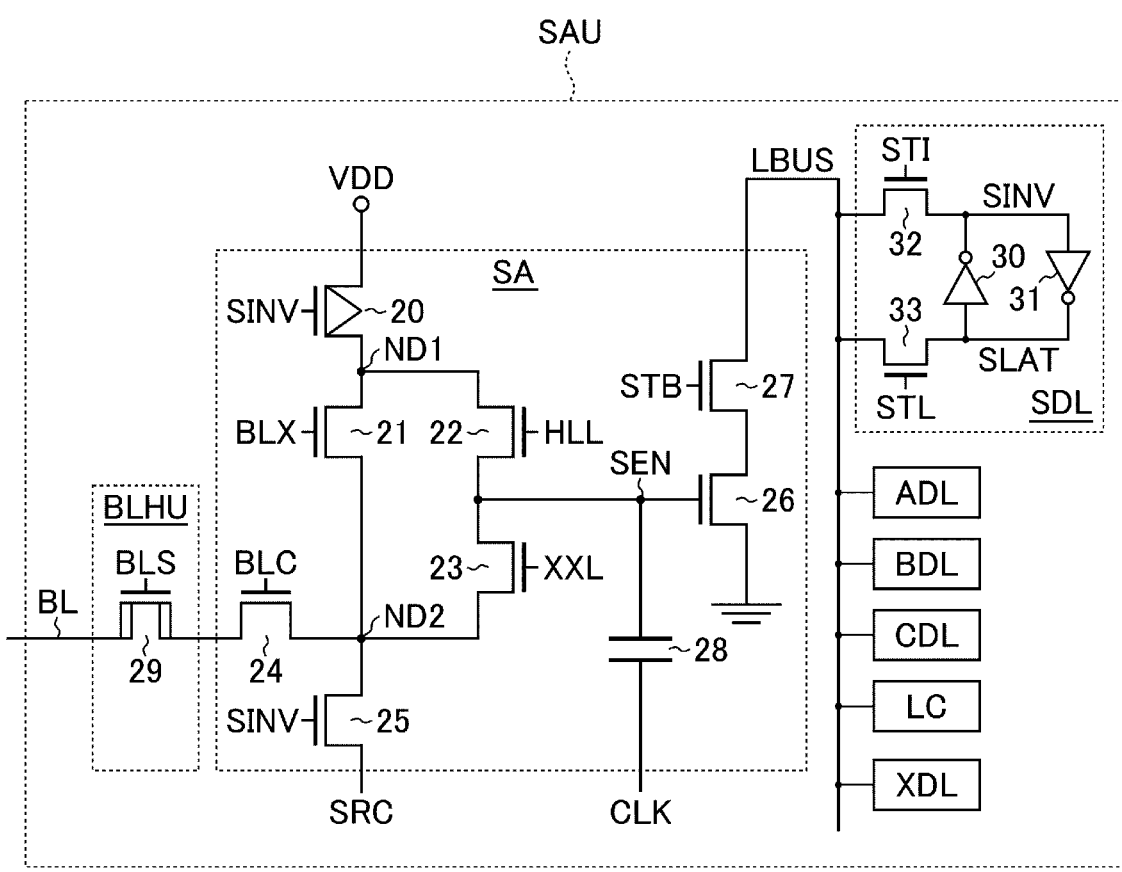
FIG. 5 is a circuit diagram of a sense amplifier unit in a sense amplifier module.

FIG. 5 illustrates an example of a circuit configuration of the sense amplifier unit SAU in the semiconductor storage device 1 according to the first embodiment. As illustrated in FIG. 5, for example, the sense amplifier unit SA includes transistors 20 to 27 and a capacitor 28, and the bit line connection unit BLHU includes a transistor 29. The transistor 20 is a P-type MOS transistor. Each of the transistors 21 to 27 is an N-type MOS transistor. The transistor 29 is an N-type MOS transistor having a higher breakdown voltage than a breakdown voltage than the transistors 20 to 27.

A source of the transistor 20 is connected to a power supply line. A drain of the transistor 20 is connected to a node ND1. A gate of the transistor 20 is connected to, for example, a node SINV of the latch circuit SDL.

A drain of the transistor 21 is connected to the node ND1. A source of the transistor 21 is connected to a node ND2. A control signal BLX is input to a gate of the transistor 21.

A drain of the transistor 22 is connected to the node ND1. A source of the transistor 22 is connected to a node SEN. A control signal HLL is input to a gate of the transistor 22.

A drain of the transistor 23 is connected to the node SEN. A source of the transistor 23 is connected to the node ND2. A control signal XXL is input to a gate of the transistor 23.

A drain of the transistor 24 is connected to the node ND2. A control signal BLC is input to a gate of the transistor 24.

A drain of the transistor 25 is connected to the node ND2. A source of the transistor 25 is connected to a node SRC. A gate of the transistor 25 is connected to, for example, a node SINV of the latch circuit SDL.

A source of the transistor 26 is grounded. A gate of the transistor 26 is connected to the node SEN.

A drain of the transistor 27 is connected to the bus LBUS. A source of the transistor 27 is connected to a drain of the transistor 26. A control signal STB is input to a gate of the transistor 27.

One electrode of the capacitor 28 is connected to the node SEN. The clock CLK is input to the other electrode of the capacitor 28.

A drain of the transistor 29 is connected to the source of the transistor 24. A source of the transistor 29 is connected to the bit line BL. A control signal BLS is input to a gate of the transistor 29.

The latch circuit SDL includes, for example, inverters 30 and 31 and N-type MOS transistors 32 and 33. An input node of the inverter 30 is connected to a node SLAT, and an output node of the inverter 30 is connected to a node SINV. An input node of the inverter 31 is connected to the node SINV, and an output node of the inverter 31 is connected to the node SLAT. One terminal of the transistor 32 is connected to the node SINV, the other terminal of the transistor 32 is connected to the bus LBUS, and a control signal STI is input to a gate of the transistor 32. One terminal of the transistor 33 is connected to the node SLAT, the other terminal of the transistor 33 is connected to the bus LBUS, and the control signal STL is input to a gate of the transistor 33. For example, data stored in the node SLAT corresponds to data stored in the latch circuit SDL, and data stored in the node SINV corresponds to inverted data of the data stored in the node SLAT.

Circuit configurations of the latch circuits ADL, BDL, CDL, and XDL are similar to, for example, the circuit configuration of the latch circuit SDL. For example, the latch circuit ADL stores data at a node ALAT and inverted data thereof at a node AINV. A control signal ATI can be input to the gate of the transistor 32 of the latch circuit ADL, and a control signal ATL can be input to the gate of the transistor 33 of the latch circuit ADL. Specific description of the latch circuits BDL, CDL, and XDL, which are similar, will be omitted.

In the circuit configuration of the sense amplifier unit SAU described above, the power supply voltage VDD is applied to the power supply line connected to the source of the transistor 20. A ground voltage VSS is applied to the node SRC. Each of the control signals BLX, HLL, XXL, BLC, STB, and BLS, and the clock CLK is generated by, for example, the sequencer 13.

The sense amplifier module 16 in a semiconductor storage device 1 according to the first embodiment is not limited to the circuit configuration described above. The number of latch circuits in each sense amplifier unit SAU may be appropriately changed based on the number of pages stored in one cell unit CU. The logic circuit LC in the sense amplifier unit SAU may be omitted as long as a logic operation can be performed with just the latch circuit in the sense amplifier unit SAU.

1-1-3. Storing Method of Data

In the semiconductor storage device 1 according to the first embodiment, a plurality of threshold voltage distributions are set according to the number of bits of data that can be stored in one memory cell transistor MT. Threshold voltages of the respective memory cell transistors MT can be in any one of a plurality of threshold voltage distributions according to the data written/stored therein. In the following, each of the threshold voltage distributions to which different data values are assigned is called a "state".

Figure 6:
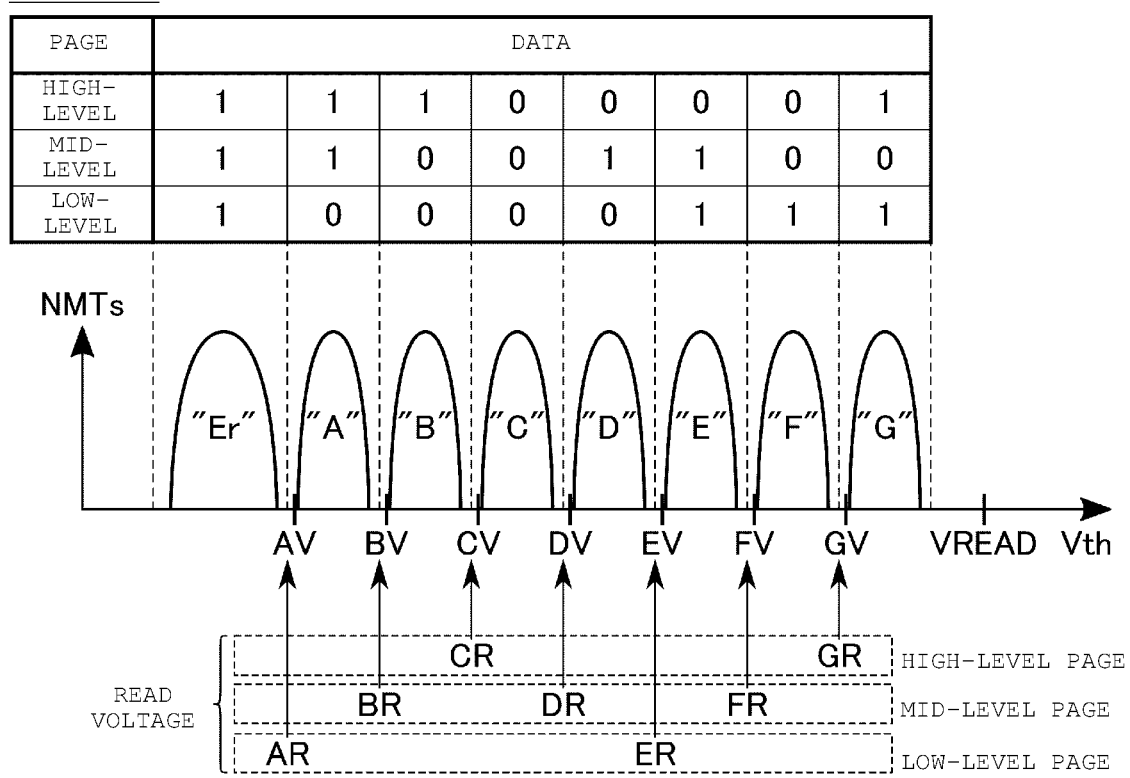
FIG. 6 is a schematic diagram illustrating an example of data allocation according to a first embodiment.

FIG. 6 illustrates an example of a threshold voltage distribution, a read voltage, and a verification voltage of the memory cell transistor MT in the semiconductor storage device 1. In the threshold voltage distribution diagrams referred to in the present disclosure, the label of "NMTs" on a vertical axis refers to the number of memory cell transistors MT, and label "Vth" on a horizontal axis refers to the threshold voltages of the memory cell transistors MT.

As illustrated in FIG. 6, in the semiconductor storage device 1, for example, eight threshold voltage distributions are formed by the plurality of memory cell transistors MT. The eight threshold voltage distributions are called an "Er" state, an "A" state, a "B" state, a "C" state, a "D" state, an "E" state, an "F" state, and a "G" state in ascending order of the threshold voltage values. The "Er" state corresponds to an erasure state of the memory cell transistor MT. Each of the "A" state to the "G" state corresponds to a data state that can be written to the memory cell transistors MT.

Different 3-bit data values are assigned to each of the "Er" state to the "G" state, but only 1-bit is different between two adjacent states. In this way, a method of storing 3-bit data in one memory cell transistor is called, for example, a triple-level cell (TLC) method. Hereinafter, an example of data allocation for the eight threshold voltage distributions (states) is listed in notation reflecting "high-level bit/mid-level bit/low-level bit" values "Er" state: "111" data
"A" state: "110" data
"B" state: "100" data
"C" state: "000" data
"D" state: "010" data
"E" state: "011" data
"F" state: "001" data
"G" state: "101" data.

A verification voltage level used in a write operation is set for each state to be between adjacent states. Specifically, a verification voltage AV is set between the "Er" state and the "A" state, a verification voltage BV is set between the "A" state and the "B" state, a verification voltage CV is set between the "B" state and the "C" state, a verification voltage DV is set between the "C" state and the "D" state, a verification voltage EV is set between the "D" state and the "E" state, a verification voltage FV is set between the "E" state and the "F" state, and a verification voltage GV is set between the "F" state and the "G" state.

In the write operation, once the semiconductor storage device 1 detects that the threshold voltage of the memory cell transistor MT intended to be storing a certain data value (state) exceeds the verification voltage corresponding to the data value, programming of the memory cell transistor MT is considered completed.

A read voltage used in a read operation is set for each of the adjacent states. Specifically, a read voltage AR is set between the "Er" state and the "A" state, a read voltage BR is set between the "A" state and the "B" state, a read voltage CR is set between the "B" state and the "C" state, a read voltage DR is set between the "C" state and the "D" state, a read voltage ER is set between the "D" state and the "E" state. A read voltage FR is set between the "E" state and the "F" state, and a read voltage GR is set between the "F" state and the "G" state. A read pass voltage VREAD is set to a voltage higher than a voltage in the "G" state.

The read voltages AR, BR, CR, DR, ER, FR, and GR are used, respectively, for distinguishing between the "Er" state and the "A" state or higher, between the "A" state or lower and the "B" state or higher, between the "B" state or lower and the "C" state or higher, between the "C" state or lower and the "D" state or higher, between the "D" state or lower and the "E" state or higher, between the "E" state or lower and the "F" state or higher, and between the "F" state or lower and the "G" state or higher.

Any memory cell transistor MT having a gate to which the read pass voltage VREAD is applied is turned on regardless of the data stored therein. In the read operation, the semiconductor storage device 1 reads the stored data by determining the state in which the memory cell transistors MT are distributed by using the read voltage(s).

For example, when the data allocation illustrated in FIG. 6 is applied, low-level page data (1-page data including low-level bits) is determined by the read operation using each of the read voltages AR and ER. The mid-level page data (1-page data including mid-level bits) is determined by the read operation using each of the read voltages BR, DR, and FR. High-level page data (1-page data high including high-level bits) is determined by the read operation using each of the read voltages CR and GR. In the read operation of a page using a plurality of read voltages, the logic circuit LC appropriately performs arithmetic processing.

The number of bits of data stored in one memory cell transistor MT described above is one example and is not limited thereto. For example, the memory cell transistor MT may store 1-bit data, 2-bit data, 4-bit data or more. In the semiconductor storage device 1, the number of threshold voltage distributions to be formed, the read voltage, the read pass voltage, the verification voltage, and the like may be appropriately set according to the number of bits stored in the memory cell transistor MT.

1-2. Operation of Semiconductor Storage Device 1

Next, an operation of a semiconductor storage device 1 according to the first embodiment will be described. In the following description, a selected word line WL can be referenced as a word line WLsel or the like. Application of a voltage to the word line WL corresponds a voltage being applied to the wire by the driver module 14 via the signal line CG and the row decoder module 15.

1-2-1. Outline of Write Operation

Figure 7:
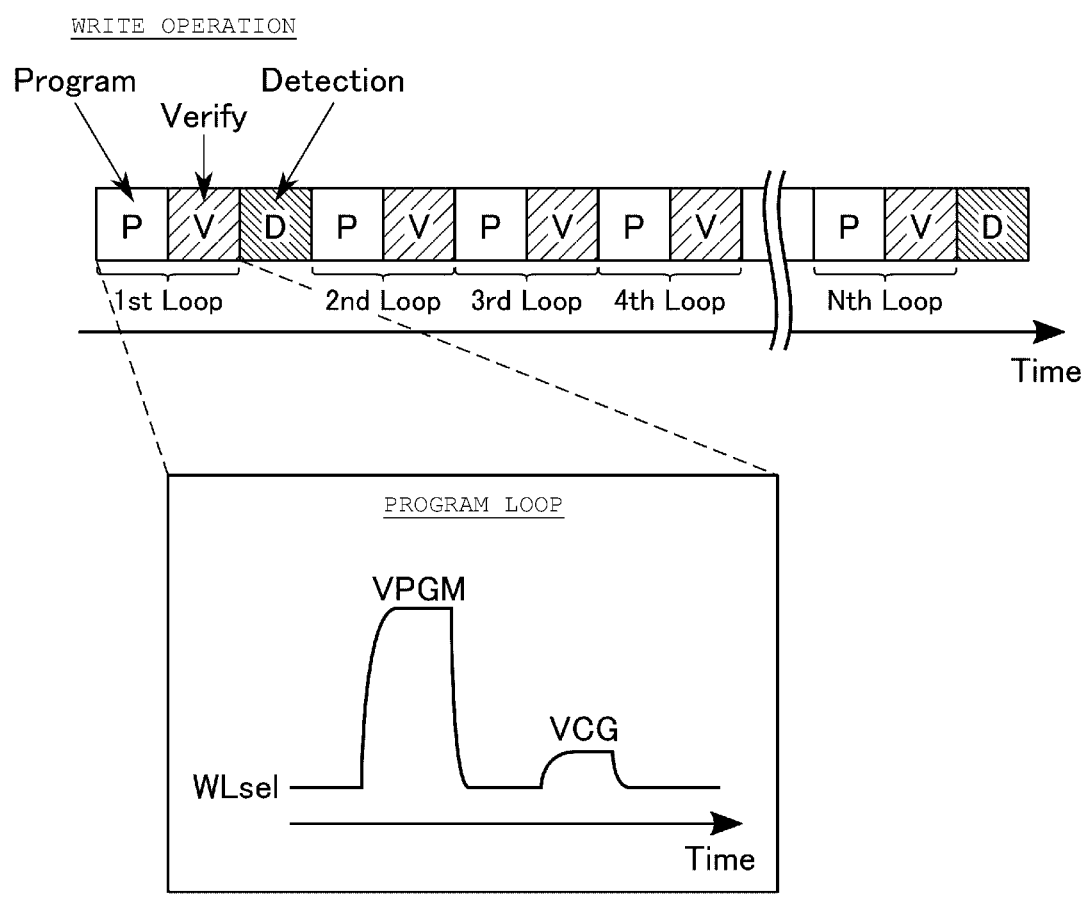
FIG. 7 is a timing chart illustrating aspects of a write operation of a semiconductor storage device according to a first embodiment.

First, outline of the write operation in the semiconductor storage device 1 according to the first embodiment will be described. FIG. 7 illustrates an example of an outline of a flow of the write operation in a semiconductor storage device 1. As illustrated in FIG. 7, the semiconductor storage device 1 repeatedly performs a program loop in the write operation. The write operation in the present example includes a program loop of N number of times (N is an integer of 2 or more). The number of program loops in the write operation may be changed depending on a wear state (hereinafter, called cell wear or cell wear state) of the memory cell transistor MT. The program loop includes a program operation ("program") and a verification operation ("verification"). The program operation and the verification operation will be briefly described below.

The program operation increases a threshold voltage of the memory cell transistor MT. In the program operation, the memory cell transistors MT in the selected cell unit CU can be set as a program target or a program inhibit target based on the write data stored in the sense amplifier unit SAU. Specifically, a memory cell transistor MT that has not yet reached a threshold voltage of an intended program state (hereinafter, called a write state) corresponding to the write data stored in the sense amplifier unit SAU is set as the program target. A memory cell transistor MT that has reached the threshold voltage of the write state is set as a program inhibit target.

In the program operation, a program voltage VPGM is applied to the word line WLsel. The program voltage VPGM is a high voltage that can increase the threshold voltage of the memory cell transistor MT. If the program voltage VPGM is applied to the word line WLsel, the threshold voltage of the memory cell transistor MT connected to the word line WLsel and connected to the bit line BL of a program target is increased. An increase in the threshold voltage of the memory cell transistor MT connected to the word line WLsel and connected to the bit line BL of the program-inhibit is prevented by, for example, a self-boost technique. If the program operation ends, the sequencer 13 performs the verification operation.

In the verification operation, the read operation using the verification voltage VCG is performed. Then, it is determined whether or not the threshold voltage of the memory cell transistor MT in the selected cell unit CU reaches the threshold voltage of the write state. The verification voltage VCG corresponds to any one of the verification voltages AV to GV, for example. The verification voltage VCG used by each sense amplifier unit SAU to determine the threshold voltage is determined based on the data stored in the latch circuit in each sense amplifier unit SAU. It is determined that the memory cell transistor MT confirmed to reach the threshold voltage of the write state by the verification read passes the verification. Each sense amplifier unit SAU stores a verification result of the write state in one of the internal latch circuits.

In the write operation, the program voltage VPGM is stepped up, for example, every time the program loop is repeated. That is, the program voltage VPGM applied to the word line WLsel increases according to the number of performed program loops. Hereinafter, the step-up amount of the program voltage VPGM is also called a step-up voltage DVPGM. The step-up voltage DVPGM may be set to any value. In the verification operation of each program loop, the type and number of states in which verification is performed may be appropriately changed according to a progress of the program loop.

The semiconductor storage device 1 performs a detection operation ("detection") after a first program loop. In this detection operation, the sequencer 13 counts the number of memory cell transistors MT which have reached a particular state (threshold voltage). The count is based on the read result from the verification operation.

In the semiconductor storage device 1, the sequencer 13 performs the detection operation between at least a first program loop ("1stLoop") and a second program loop ("2ndLoop"). Then, the sequencer 13 can change program processing for the second and subsequent program loops based on a result from the detection operation performed after the first program loop.

After each verification operation, the sequencer 13 can determine whether or not the writing of the memory cell transistors MT is completed as intended. For example, once a predetermined number of memory cell transistors MT are verified as having the intended state (threshold voltage), the write operation ends. If, after a predetermined number of repetitions of the program loop, the sequencer 13 still finds that the number of the memory cell transistors MT which have passed verification is still less than the predetermined number, the write operation ends.

Figure 8:
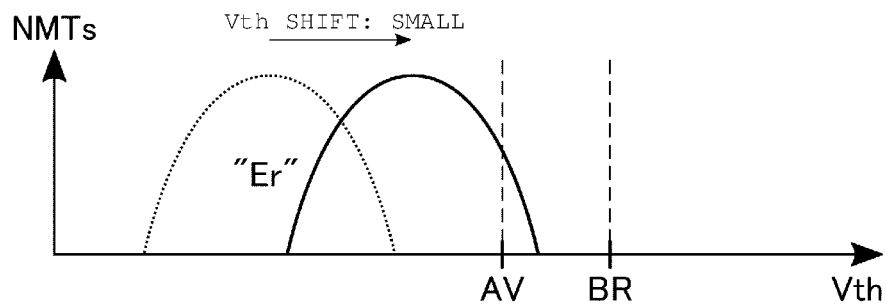
FIG. 8 is a threshold voltage distribution diagram illustrating changes in threshold voltage distributions due to a first program loop in a write operation of a semiconductor storage device according to a first embodiment.
Figure 8:
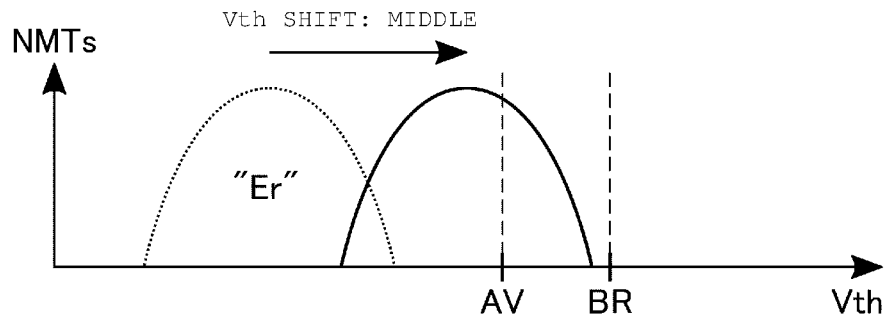
Figure 8:
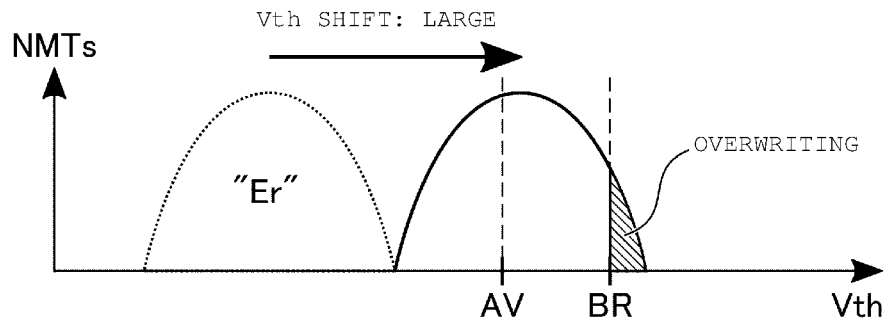

Here, an example of characteristics of the memory cell transistors MT will be described with reference to FIG. 8. Hereinafter, the program voltage VPGM used in the first program loop is called VPGMinit. FIG. 8 illustrates examples of a change in the threshold voltage distribution of the memory cell transistors MT due to the first program loop in the write operation of the semiconductor storage device 1 according to the embodiment. Parts (1) to (3) of FIG. 8 correspond to cases where the cell wear of the cell unit CU of a write target is low, middle, and high, respectively. Each of the parts (1) to (3) of FIG. 8 illustrates a change in the threshold voltage for the same program voltage VPGMinit.

As illustrated in part (1) of FIG. 8, the program voltage VPGM is set with the intention that a threshold voltage of the memory cell transistor MT being written will exceed the verification voltage AV but be lower than the read voltage BR after the first program loop. Generally, the program voltage VPGM would be set assuming that the cell wear is low. A position change of the peak of the threshold voltage distribution (also called a Vth shift) when the cell wear is low is "small". As illustrated in part (2) of FIG. 8, if the cell wear is middle, the Vth shift will be somewhat greater (Vth shift: middle). As illustrated in part (3) of FIG. 8, if the cell wear is high, the Vth shift will be even larger (Vth shift: large).

As can be seen in FIG. 8, the Vth shift of the memory cell transistors MT in a program operation changes according to cell wear level. Specifically, the higher the cell wear, the larger the Vth shift of the memory cell transistors MT will be.

If the Vth shift in the first program loop is too large, "overwriting" (see part (3) of FIG. 8) of the memory cell transistor MT intended to be in the "A" state write may occur due. In other words, the threshold voltage of the memory cell transistor MT of a write target can exceed the read voltage BR due to the first program loop. In the present specification, it is assumed that overwriting occurs, for example, when the total number of memory cell transistors MT exceeding the verification voltage AV among the memory cell transistors MT of the "A" state write exceeds a certain value rather than by performing a read operation using the read voltage BR on these memory cell transistors MT.

Figure 9:
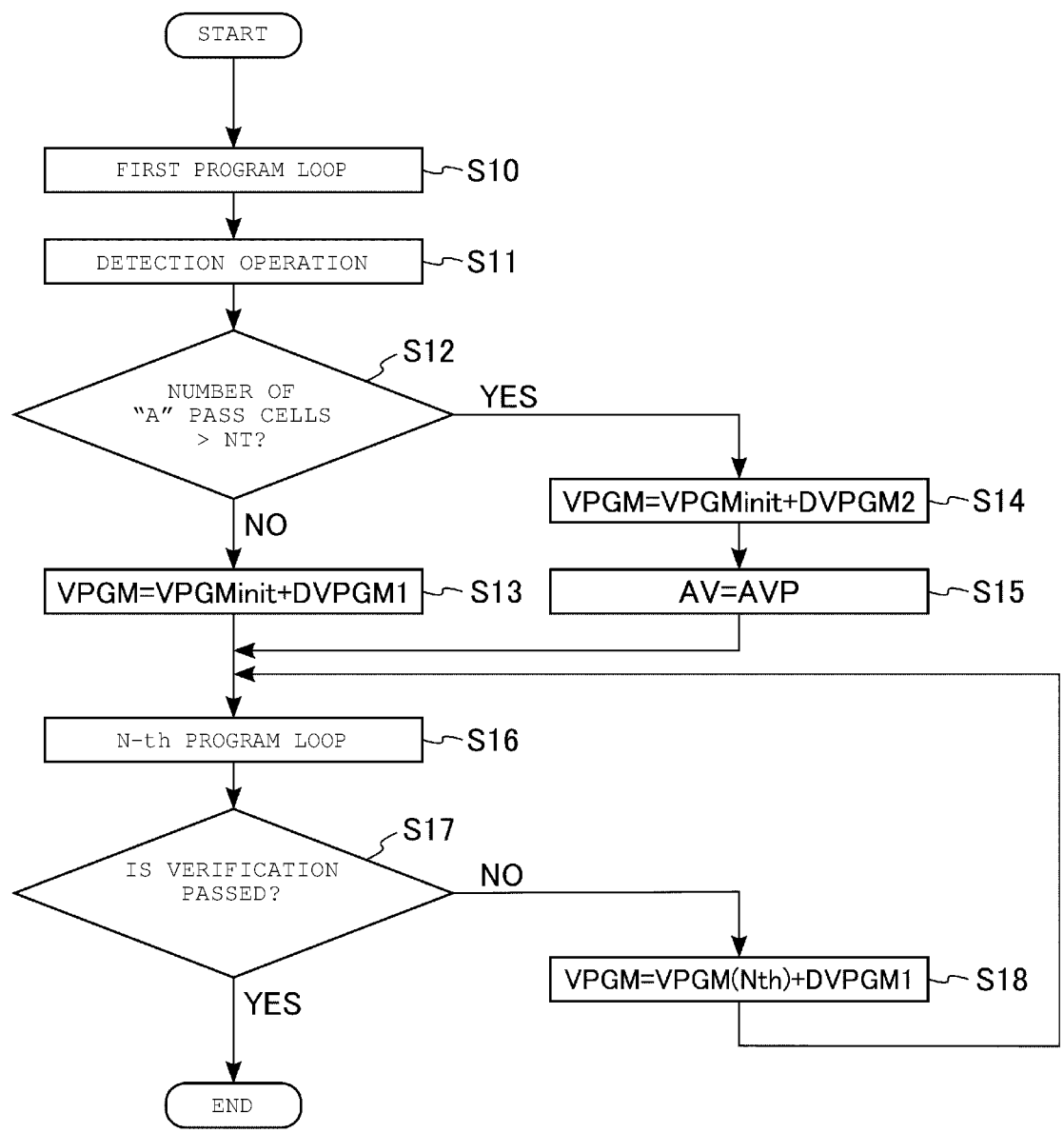
FIG. 9 is a flowchart for a write operation of a semiconductor storage device according to a first embodiment.

The semiconductor storage device 1 can detects the occurrence (or extent) of overwriting in the detection operation after the first program loop and then change write operation parameters of the second and subsequent program loops. FIG. 9 illustrates an example of a flowchart of the write operation of the semiconductor storage device 1. As illustrated in FIG. 9, in the write operation, the sequencer 13 can perform processing of steps S10 to S18.

Specifically, the sequencer 13 first performs a first program loop (step S10). After the first program loop, the sequencer 13 performs a detection operation (step S11). The detection operation in this context is a counting of the number of memory cell transistors MT at or above the "A" level threshold value AV according to the verification operation. Next, the sequencer 13 checks whether or not the counted number of memory cell transistors MT passing the "A" verification (the number of "A" pass cells) exceeds a predetermined threshold NT (step S12).

When the number of "A" pass cells is less than or equal to the threshold NT (step S12, NO), the sequencer 13 changes the program voltage VPGM for the next program loop to be VPGMinit+DVPGM1. That is, the program voltage VPGM is stepped up by DPVGM1 (step S13) for the next program loop (that is, the second program loop).

When the number of "A" pass cells exceeds the threshold NT (step S12, YES), the sequencer 13 changes the program VPGM for the next program loop to be VPGMinit+DVPGM2. That is, the program voltage VPGM is stepped up by DPVGM2 (step S14) for the next program loop (that is, the second program loop). In this context, DVPGM2 is a value less than DVPGM1. Furthermore, the sequencer 13 changes the "A" state threshold value AV to be AVP. That is, a voltage used for verifying the "A" state is set to the verification voltage AVP (step S15). AVP is a voltage higher than the verification voltage AV at the start of the write operation, but still lower than the read voltage BR.

After processing of step S13 or S15, the sequencer 13 performs the second program loop (N-th program loop) (step S16). Then, the sequencer 13 checks whether or not verification is passed (step S17).

When verification is not passed (step S17, NO), the sequencer 13 offsets the program voltage VPGM=VPGM (N-th)+DVPGM1. That is, the program voltage VPGM used in the previous program loop (VPGMNth) is stepped up by DPVGM1 (step S18). Thereafter, the sequencer 13 returns to step S16 and a program loop again (step S16 is repeated) and then determination operation of step S17. When it is confirmed that verification is passed (step S17, YES), the sequencer 13 ends the write operation.

The sequencer 13 may perform the processing of step S18 after the process of step S16 according to the number of program loops performed. In other words, the sequencer 13 may omit step 17 until the program loop (step 16) has been performed a predetermined number of times. A trigger for ending the write operation is not limited to the processing of step S17. For example, the sequencer 13 may end the write operation based on the program loop being performed a predetermined number of times.

1-2-2. Specific Example of Write Operation

Hereinafter, a specific example of the write operation in the semiconductor storage device 1 according to the first embodiment will be described.

Regarding Write Operation when Cell Wear is Low

Figure 10:
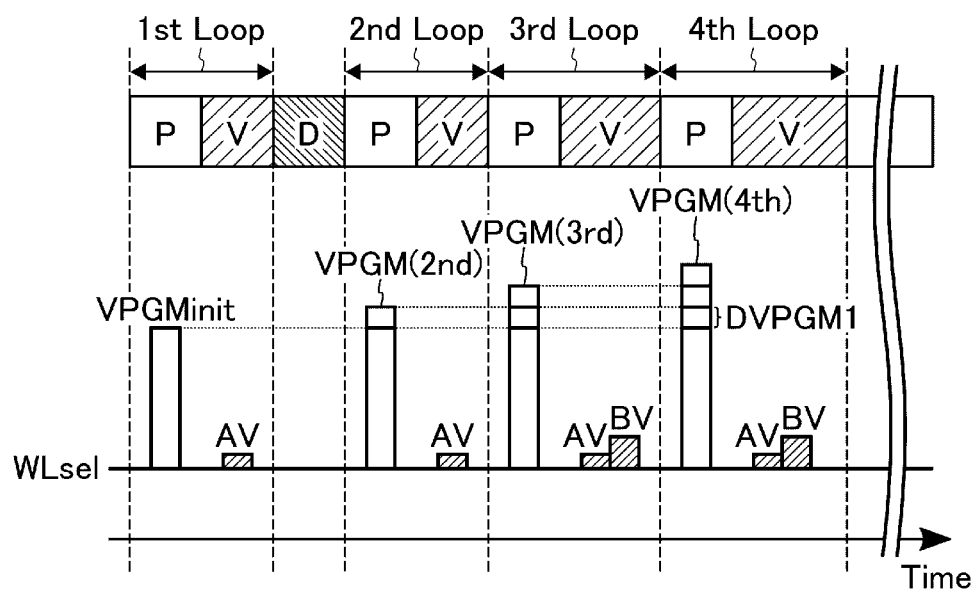
FIG. 10 is a timing chart illustrating an example of processing when cell wear is low in a write operation of a semiconductor storage device according to a first embodiment.

FIG. 10 is an example of processing when a cell wear is low in a write operation of the semiconductor storage device 1 and illustrates voltages applied to the word line WLsel in the first to fourth program loops. In the following description, it is assumed that the sequencer 13 performs verification of the "A" state in the first and second program loops, and performs verification of the "A" and "B" states in the third and fourth program loops.

As illustrated in FIG. 10, in the first program loop ("1st Loop"), the program voltage VPGMinit and the verification voltage AV are sequentially applied to the word line WLsel. Since cell wear is low, the sequencer 13 performs the processing of step S13 after the detection operation of step S12. That is, in the second program loop ("2nd Loop"), the program voltage VPGM is set to VPGMinit+DVPGM1 and the verification voltage AV are sequentially applied to the word line WLsel.

Thus, in the third program loop ("3rd Loop"), the program voltage VPGM is set to VPGMinit+DVPGM1×2 and the verification voltages AV and By are sequentially applied to the word line WLsel. In the fourth program loop ("4th Loop"), the program voltage VPGM is set to VPGMinit+DVPGM1×3 and the verification voltages AV and BV are sequentially applied to the word line WLsel. Thereafter, is additional program loops are required, the sequencer 13 appropriately performs a program loop including a program operation in which the program voltage is stepped up in increments of DVPGM1 and a verification operation according to a progress of the write operation.

Figure 11:
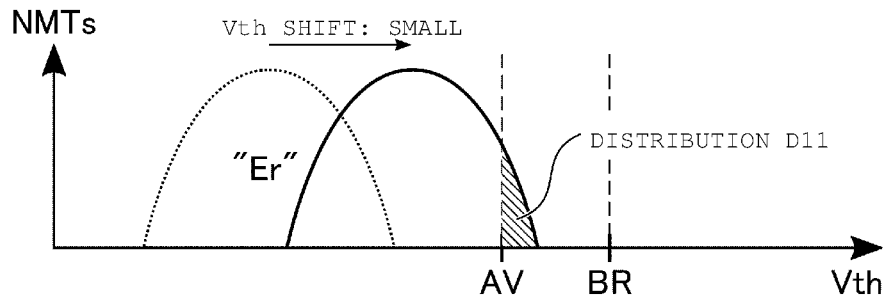
FIG. 11 is a threshold voltage distribution diagram illustrating changes in threshold voltage distributions when cell wear is low in a write operation of a semiconductor storage device according to a first embodiment.
Figure 11:
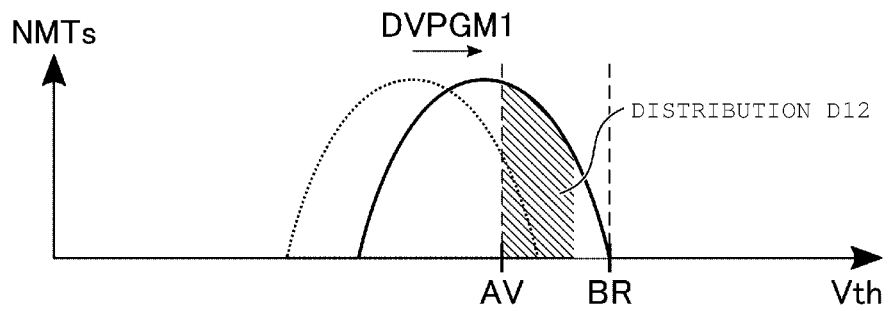
Figure 11:
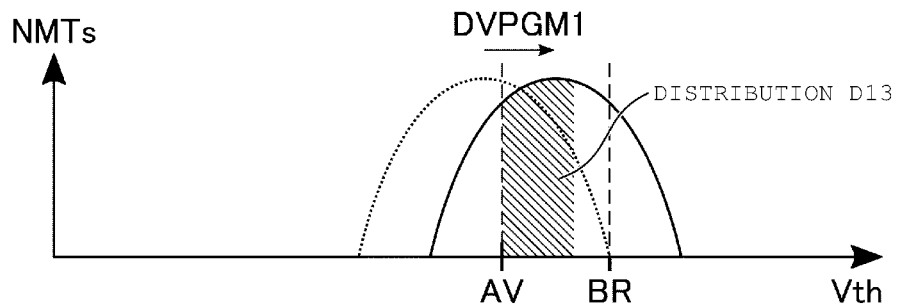
Figure 11:
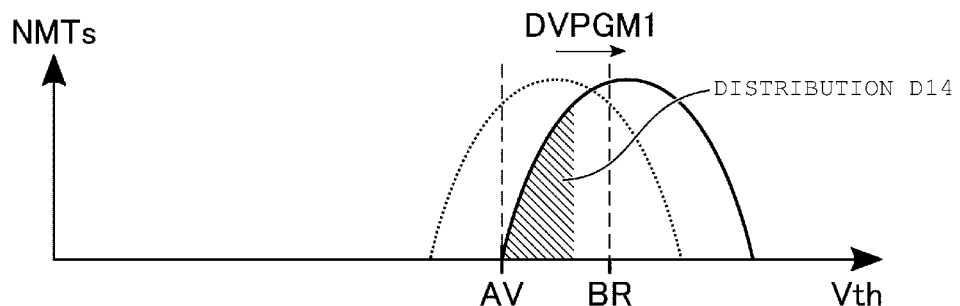

FIG. 11 illustrates an example of a change in a threshold voltage distribution of the memory cell transistors MT when cell wear is low in the write operation of the semiconductor storage device 1. Parts (1) to (4) of FIG. 11 correspond to the threshold voltage distributions immediately after the first to fourth program loops, respectively. In the present example, it is assumed that threshold voltages of the plurality of memory cell transistors MT being written will exceed the verification voltage AV in the first to fourth program loops.

As illustrated in part (1) of FIG. 11, when the cell wear is low, the Vth shift after the first program loop is small. For example, an upper end range of the threshold voltage distribution after the first program loop is located between the verification voltage AV and the read voltage BR. The threshold voltage distribution formed by the plurality of memory cell transistors MT having threshold voltages exceeding the verification voltage AV Here is referred to as "D11" (distribution D11).

As illustrated in part (2) of FIG. 11, in the second program loop, the threshold voltage distribution shifts based on the step-up voltage DVPGM1. For example, the upper end range of the threshold voltage distribution after the second program loop is located near the read voltage BR. Here, the threshold voltage distribution formed by the plurality of memory cell transistors MT having threshold voltages exceeding the verification voltage AV but not included in the distribution D11 is called "D12" (distribution D12).

As illustrated in part (3) of FIG. 11, in the third program loop, the threshold voltage distribution shifts based on the step-up voltage DVPGM1. For example, the upper end range of the threshold voltage distribution after the third program loop exceeds the read voltage BR. Here, the threshold voltage distribution formed by the plurality of memory cell transistors MT having threshold voltages exceeding the verification voltage AV but not included in the distributions D11 and D12 is called "D13" (distribution D13).

As illustrated in part (4) of FIG. 11, in the fourth program loop, the threshold voltage distribution shifts based on the step-up voltage DVPGM1. For example, a lower end range of the threshold voltage distribution after the fourth program loop now exceeds the verification voltage AV. Here, a threshold voltage distribution formed by the plurality of memory cell transistors MT having threshold voltages exceeding the verification voltage AV but not included in the distributions D11, D12, and D13 is called "D14" (distribution D14).

Verification for the memory cell transistors MT in the "A" state write will be passed now since the threshold voltage exceeds the verification voltage AV. That is, the memory cell transistor MT of the "A" state write is included in any of the distributions D11, D12, D13, and D14. As a result, the threshold voltage distribution of the "A" state is formed by the sum of the memory cell transistors MT of the "A" state write included in any of the distributions D11, D12, D13, and D14.

Regarding Write Operation when Cell Wear is High

Figure 12:
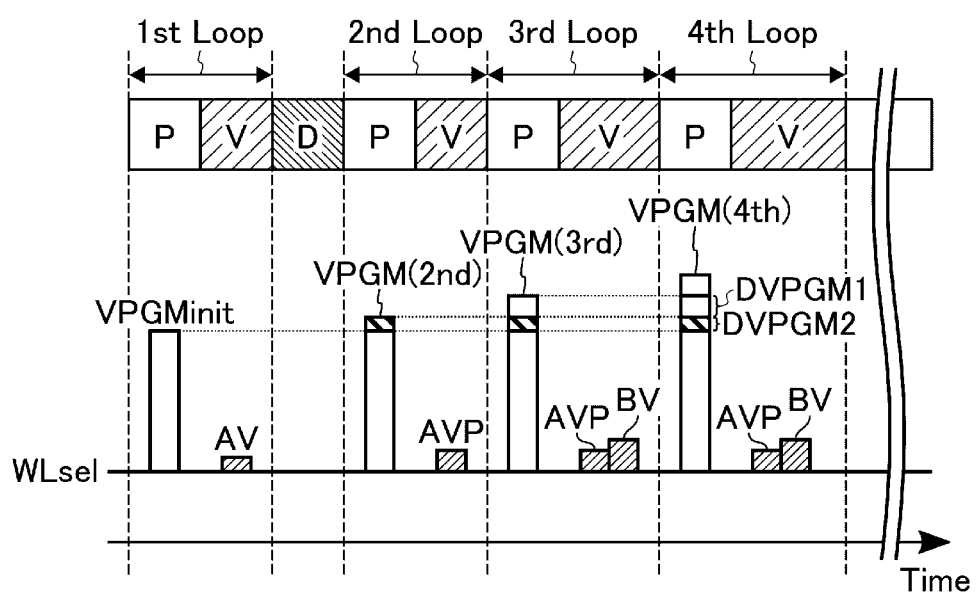
FIG. 12 is a timing chart illustrating an example of processing when the cell wear is high in a write operation of a semiconductor storage device according to a first embodiment.

FIG. 12 is an example of processing when cell wear is high.

As illustrated in FIG. 12, in the first program loop ("1st Loop"), the program voltage VPGMinit and the verification voltage AV are sequentially applied to the word line WLsel. Since the cell wear is high (as determined in step 12), the sequencer 13 performs the processing of steps S14 and S15 after the detection operation. That is, in the second program loop ("2nd Loop"), VPGMinit+DVPGM2 and the verification voltage AVP are sequentially applied to the word line WLsel. A voltage stepped up by the processing of step S18 is used as the program voltage VPGM in the subsequent program loops, and a verification voltage for the "A" state is set to AVP.

In the third program loop ("3rd Loop"), VPGMinit+DVPGM2+DVPGM1 and the verification voltages AVP and BV are sequentially applied to the word line WLsel. In the fourth program loop ("4th Loop"), VPGMinit+DVPGM2+DVPGM1×2 and the verification voltages AVP and BV are sequentially applied to the word line WLsel. Thereafter, the sequencer 13 appropriately performs a program loop including a program operation in which the program voltage is stepped up in additional increments of DVPGM1 and a verification operation according to a progress of the write operation.

Figure 13:
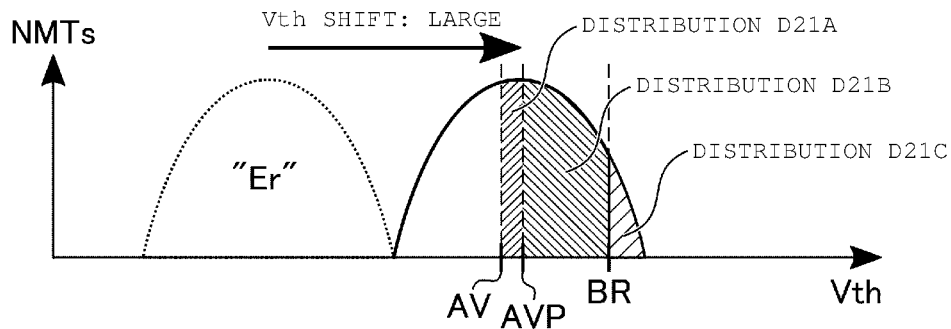
FIG. 13 is a threshold voltage distribution diagram illustrating changes threshold voltage distributions when cell wear is high in a write operation of a semiconductor storage device according to a first embodiment.
Figure 13:
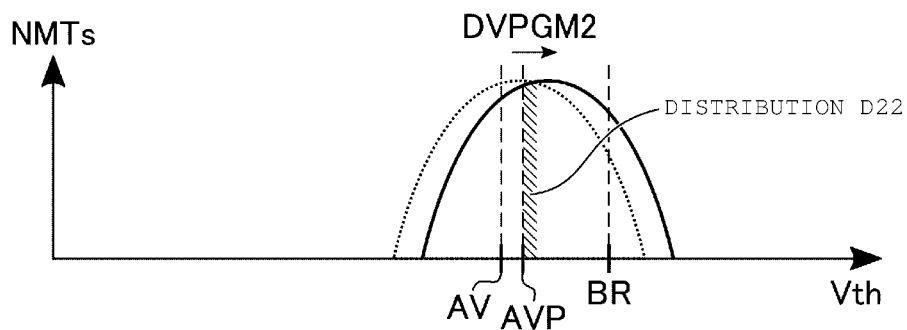
Figure 13:
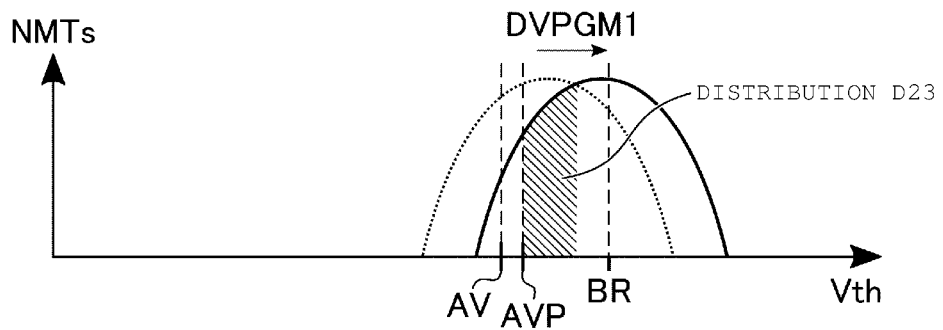
Figure 13:
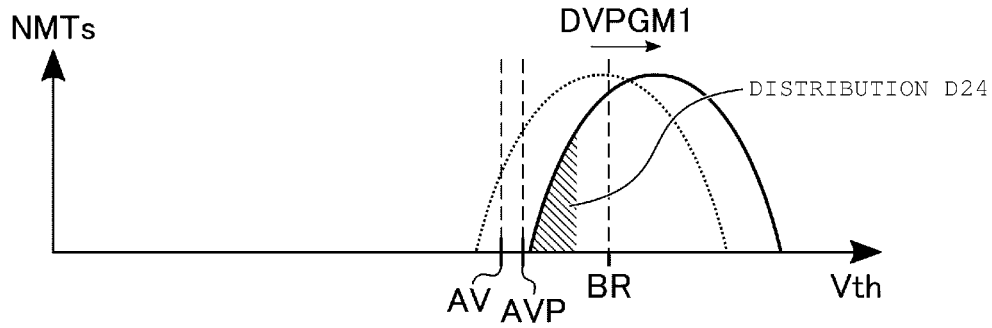

FIG. 13 illustrates an example of a change in a threshold voltage distribution of the memory cell transistor MT when cell wear is high in a write operation of the semiconductor storage device 1. Parts (1) to (4) of FIG. 13 correspond to the threshold voltage distributions immediately after the first to fourth program loops, respectively.

As illustrated in part (1) of FIG. 13, when the cell wear is high, the Vth shift after the first program loop is large. For example, an upper end range of the threshold voltage distribution after the first program loop already exceeds the read voltage BR. Here, the threshold voltage distribution formed by the memory cell transistors MT having threshold voltages between the verification voltage AV and AVP is called "D21A" (distribution D21A), the threshold voltage distribution formed by the memory cell transistor MT having threshold voltages between the verification voltage AVP and the read voltage BR is called "D21B" (distribution D21B), and the threshold voltage distribution formed by the plurality of memory cell transistors MT having threshold voltages exceeding the read voltage BR is called "D21C" (distribution D21C).

As illustrated in part (2) of FIG. 13, in the second program loop, the threshold voltage distribution shifts based on the step-up voltage DVPGM2 (which is less than DVPGM1). That is, a shift amount of the threshold voltage distribution in the second program loop is less than if the step-up voltage DPGM1 was applied. Here, the threshold voltage distribution formed by the plurality of memory cell transistors MT having the threshold voltage distribution exceeding the verification voltage AVP but not included in the distributions D21A, D21B, and D21C is called "D22" (distribution D22).

As illustrated in part (3) of FIG. 13, in the third program loop, the threshold voltage distribution shifts now based on the step-up voltage DVPGM1. For example, the upper end range of the threshold voltage distribution after the third program loop exceeds the read voltage BR by an even greater amount. Here, the threshold voltage distribution formed by the plurality of memory cell transistors MT having the threshold voltages exceeding the verification voltage AVP but not included in the distributions D21A, D21B, D21C, and D22 is called "D23" (distribution D23).

As illustrated in part (4) of FIG. 13, in the fourth program loop, the threshold voltage distribution shifts based on the step-up voltage DVPGM1. For example, a lower end range of the threshold voltage distribution after the fourth program loop now exceeds the verification voltage AV. Here, the threshold voltage distribution formed by the plurality of memory cell transistors MT having the threshold voltages exceeding the verification voltage AVP but not included in the distributions D21A, D21B, D21C, D22, and D23 is called "D24" (distribution D24).

Verification for the memory cell transistors MT in the "A" state write is passed in a program loop in which the threshold voltage exceeds the verification voltage AV in the first program loop, or a program loop in which the threshold voltage exceeds the verification voltage AVP in the second and subsequent program loops. That is, the memory cell transistor MT of the "A" state write is included in any one of the distributions D21A, D21B, D21C, D22, D23, and D24. As a result, the threshold voltage distribution of the "A" state is formed by the sum of the plurality of memory cell transistors MT of the "A" state write included in any one of the distributions D21A, D21B, D21C, D22, D23, and D24.

1-3. Effects of an Embodiment

With a semiconductor storage device 1 of the first embodiment, it is possible to prevent a decrease in writing speed and to prevent spread and bias of a threshold voltage distribution.

In a semiconductor storage device, threshold voltages of the plurality of memory cell transistors MT after an erase operation and a write operation have a variation close to a normal distribution. The variation in the threshold voltages can change depending on shapes of the memory cell transistors MT and a state of cell wear. Furthermore, in the write operation, the threshold voltages of the memory cell transistors MT of a write target are ideally within a range from a verification voltage of the associated write state to a voltage obtained by adding the step-up voltage DVPGM to the verification voltage.

When the program voltage VPGMinit used in the first program loop is high and a cell wear is high, overwriting due to the first program loop may occur in the memory cell transistor MT of the "A" state write. Occurrence of the overwriting in the "A" state can be prevented by setting the program voltage VPGMinit to be low. However, if the program voltage VPGMinit is reduced, the number of program loops performed in the write operation increases, and a write time is lengthened.

As a method of preventing the overwriting in the "A" state without reducing the program voltage VPGMinit, characteristics of another cell unit CU sharing the word line WL can be used to estimate characteristics of another cell unit CU, and the result can be calculated, and it is possible to adjust the program voltage VPGMinit of another cell unit CU by using the results from a related (or similar) cell unit CU. Thereby, in the cell unit CU to which such feedback adjustments str applied, a semiconductor storage device can perform a program operation by using a more likely to be optimum program voltage VPGMinit, and thereby, a write time in the cell unit CU can be reduced.

However, according to this method, the write time of the specific cell unit CU is lengthened by using the low program voltage VPGMinit. This method may require a storage region for storing information on characteristics of the cell unit CU. For example, when the write operation can be in more than one block BLK unit, a storage region for an area calculated by multiplying the total quantity of the blocks BLK to be written by the total number of the word lines WL of each block is required. Providing the storage region leads to an increase in a circuit area of the memory cell array 10 and can become a factor in increasing a chip area of the semiconductor storage device 1.

In the semiconductor storage device 1, the program voltage VPGMinit used in the first program loop is set as high as possible. In this case, overwriting in the first program loop may occur due to a high cell wear. The overwriting may also occur in the program operation in the second program loop. However, the semiconductor storage device 1 prevents overwriting that may occur in a second program loop, thereby, reducing a write time and preventing spread of an upper end range of a threshold voltage distribution in the "A" state.

Specifically, the semiconductor storage device 1 checks a cell wear state of the cell unit CU of a write target according to a detection operation after a first program loop. Then, when the cell wear is low, the semiconductor storage device 1 applies DVPGM1 to a step-up amount of a program voltage used in second and subsequent program loops. When the cell wear is high, the semiconductor storage device 1 applies DVPGM2 lower than DVPGM1 to the step-up amount of the program voltage used in the second program loop and changes a verification voltage in the "A" state to AVP. The semiconductor storage device applies DVPGM1 to the step-up amount of the program voltage used in third and subsequent program loops.

Figure 14:
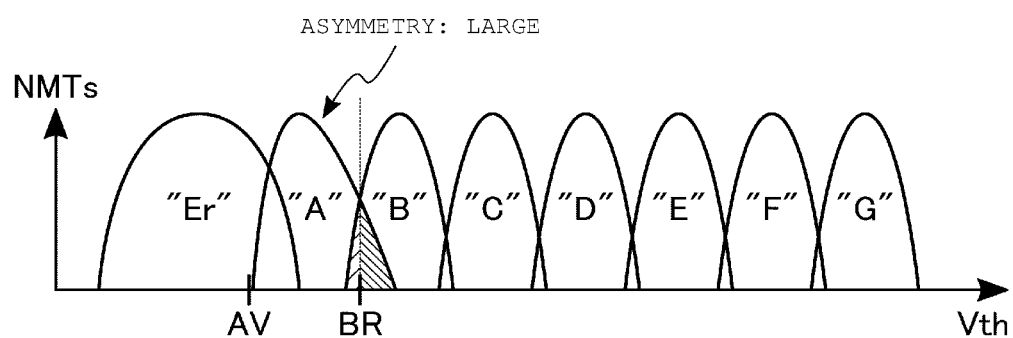
FIG. 14 is a threshold voltage distribution diagram illustrating threshold voltage distributions of memory cell transistors of a semiconductor storage device according to a comparative example.
Figure 15:
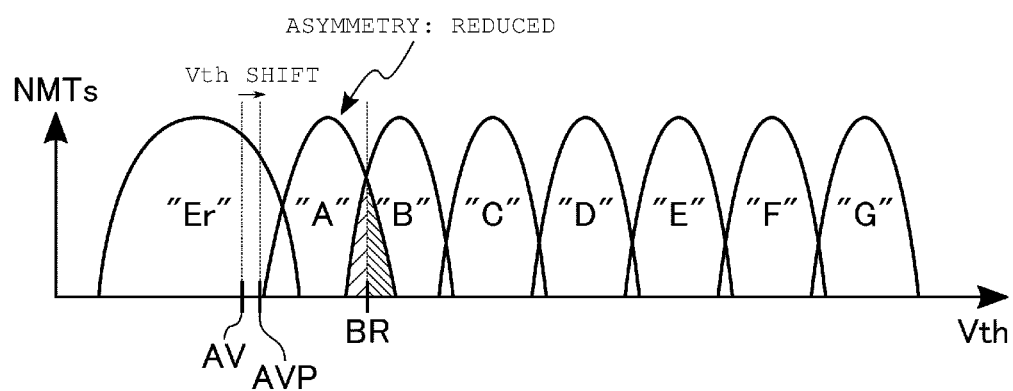
FIG. 15 is a threshold voltage distribution diagram illustrating threshold voltage distributions of memory cell transistors of a semiconductor storage device according to a first embodiment.

Here, the threshold voltage distribution of the memory cell transistor MT when the cell wear is high will be described with reference to FIGS. 14 and 15 by using a comparative example. FIGS. 14 and 15 illustrate examples of threshold voltage distributions of the memory cell transistors MT in the comparative example and the first embodiment, respectively. When the cell wear is high, the comparative example corresponds to a write operation in which the step-up voltage DVPGM is not changed. A shape and a position of the threshold voltage distribution in the "A" state are different between FIG. 14 and FIG. 15.

As illustrated in FIG. 14, in the comparative example, an upper end range of the threshold voltage distribution in the "A" state is widened. The widening of the upper end range is caused by, for example, overwriting due to a program loop of the early write operation. If overwriting in an early program loop occurs, asymmetry (skew) of the threshold voltage distribution in the "A" state tends to increase. When the asymmetry of the threshold voltage distribution increases, it is difficult to set an optimum read voltage between the "A" state and the "B" state, and thus, there is a possibility that the number of error bits increases. As a result, in the semiconductor storage device according to the comparative example, a probability of success in error correction by the memory controller 2 or the like may decrease.

As illustrated in FIG. 15, in the embodiment, spread of the upper end range of the threshold voltage distribution of the "A" state is prevented by reducing the program voltage used in the second program operation. Further, spread of a lower end range of the threshold voltage distribution of the "A" state is prevented by using the verification voltage AVP, and the center of gravity of the threshold voltage distribution of the "A" state is shifted in a positive direction. As a result, in the first embodiment, the asymmetry of the threshold voltage distribution of the "A" state is improved (that is, reduced).

As described above, the semiconductor storage device 1 can reduce a write time during which a cell wear is low, and furthermore, can prevent an upper end range of a threshold voltage distribution of the "A" state when the cell wear is high. In other words, the semiconductor storage device 1 according to the first embodiment can prevent a decrease in write speed and can prevent spread and bias of the threshold voltage distribution.

As a result, the semiconductor storage device 1 can set an optimum read voltage between the "A" state and the "B" state. The semiconductor storage device 1 can reduce the number of error bits in a read operation by using the read voltage AR and can increase a probability of success of error correction made by the memory controller 2 or the like.

In the semiconductor storage device 1, a verification voltage in the "A" state is changed to AVP, and thereby, the memory cell transistor MT of the "A" state write corresponding to the distribution D21A illustrated in FIG. 13 remains as a lower end range of the threshold voltage distribution in the "A" state. However, an influence on the spread of the threshold voltage distribution is dominated by spread of a threshold voltage distribution due to noise or the like of the write operation, rather than the remaining memory cell transistors MT of the "A" state write corresponding to the distribution D21A. Therefore, an influence of the distribution D21A on the final threshold voltage distribution of the "A" state is small.

Furthermore, increasing the verification voltage of the "A" state during the write operation may cause the spread of the upper end range of the threshold voltage distribution of the "A" state. However, the semiconductor storage device 1 reduces the step-up amount of the program voltage used in the second program loop. Therefore, the spread of the upper end range of the threshold voltage distribution of the "A" state due to the increase of the verification voltage can be offset by the decrease in the amount of increase in the threshold voltage due to the second program operation. In addition, increasing the verification voltage of the "A" state prevent overlapping of threshold voltage distributions between the "Er" state and the "A" state. That is, the semiconductor storage device 1 can also secure the margin of the read operation by the read voltage AR.

Further, the write time during which the processing of steps S14 and S15 are performed can be increased due to an increase in the number of program loops. However, the write operation for the memory cell transistor MT in a high cell wear state tends to be completed earlier than the write operation for the memory cell transistor MT in a low cell wear state. Therefore, the increase in the number of program loops that may occur when the processing of steps S14 and S15 is performed can be offset by the decrease in the number of program loops necessary due to the cell wear.

In the write operation according to the first embodiment, the processing of step S15 may be omitted. In other words, when the number of "A" pass cells exceeds the predetermined threshold NT in step S12, the verification voltage in the "A" state may not be set to AVP. In the semiconductor storage device 1, a step-up amount of a program voltage used in at least the second program loop may be changeable based on the verification result of the first program loop. Even in the case, the semiconductor storage device 1 can prevent the spread of the upper end range of the threshold voltage distribution in the "A" state.

In the write operation according to the first embodiment, the processing of step S14 may be omitted. In other words, when the number of "A" pass cells exceeds the predetermined threshold NT in step S12, only the verification voltage in the "A" state may be changed without stepping up the program voltage VPGM. Even in this case, the semiconductor storage device 1 can prevent spread of a lower end range of the threshold voltage distribution in the "A" state and the spread of the upper end range of the threshold voltage distribution of the "A" state.

When the number of "A" pass cells exceeds the predetermined threshold NT in step S12, the same step-up voltage DVPGM1 as in a case where the cell wear is low may be applied to the step-up amount of the program voltage VPGM, and only the verification voltage in the "A" state may be changed. Even in the case, the semiconductor storage device 1 can prevent the spread of the lower end range of the threshold voltage distribution in the "A" state.

2. First Modification Example

Figure 16:
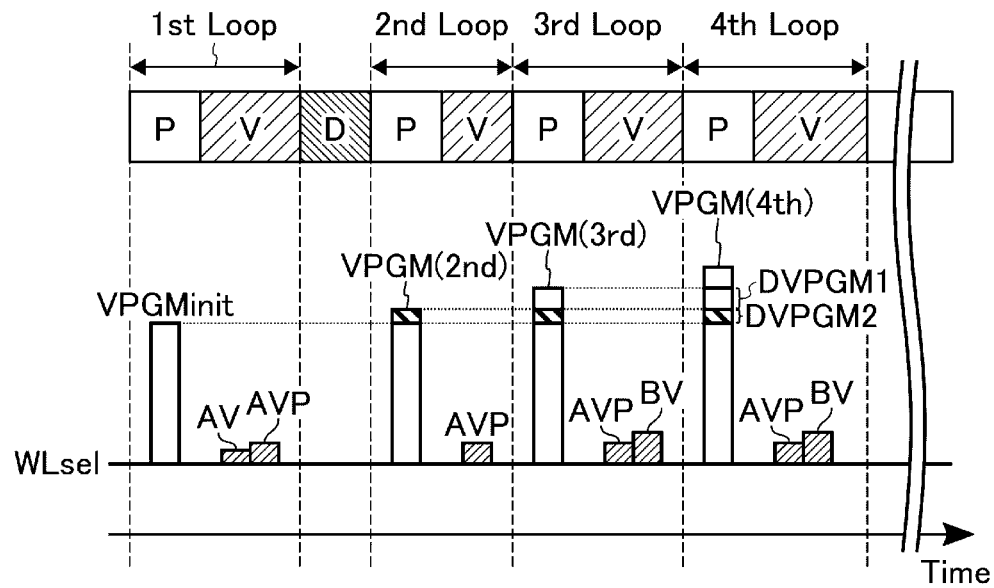
FIG. 16 is a timing chart illustrating an example of processing when cell wear is high in a write operation of a semiconductor storage device according to a first modification example.

FIG. 16 is an example of processing when a cell wear is high in a write operation of a semiconductor storage device 1 according to a first modification example, and illustrates voltages applied to the word line WLsel in first to fourth program loops. As illustrated in FIG. 16, the write operation according to the first modification example differs from the write operation illustrated in FIG. 12 in processing a verification operation in the first program loop.

Specifically, in the first modification example, the verification voltages AV and AVP are, for example, respectively applied to the word line WLsel in the verification operation of the first program loop. Then, the sequencer 13 counts the number of memory cell transistors MT exceeding, for example, the verification voltage AVP, in a subsequent detection operation. Then, the sequencer 13 compares the count result with the threshold NT and proceeds to the processing of step S13 or S14. Other operations according to the first modification example are similar to the operation according to the embodiment.

The semiconductor storage device 1 according to the first modification example sets the verification voltage associated with the first detection operation to a value other than the verification voltage AV. As such, a determination condition (that is, the processing of step S12) associated with the first detection operation may not necessarily use a read result by the verification voltage AV. The verification voltage associated with the first detection operation is not limited to AVP, and other voltages may also be applied.

As a result, the semiconductor storage device 1 according to the first modification example can obtain the same effect as the first embodiment and can finely adjust a timing for starting processing when a cell wear is high in the write operation. Furthermore, the semiconductor storage device 1 according to the first modification example reduces a detection operation time by setting the number of memory cell transistors MT that can be counted in the first detection operation to an appropriate range.

3. Second Modification Example

Figure 17:
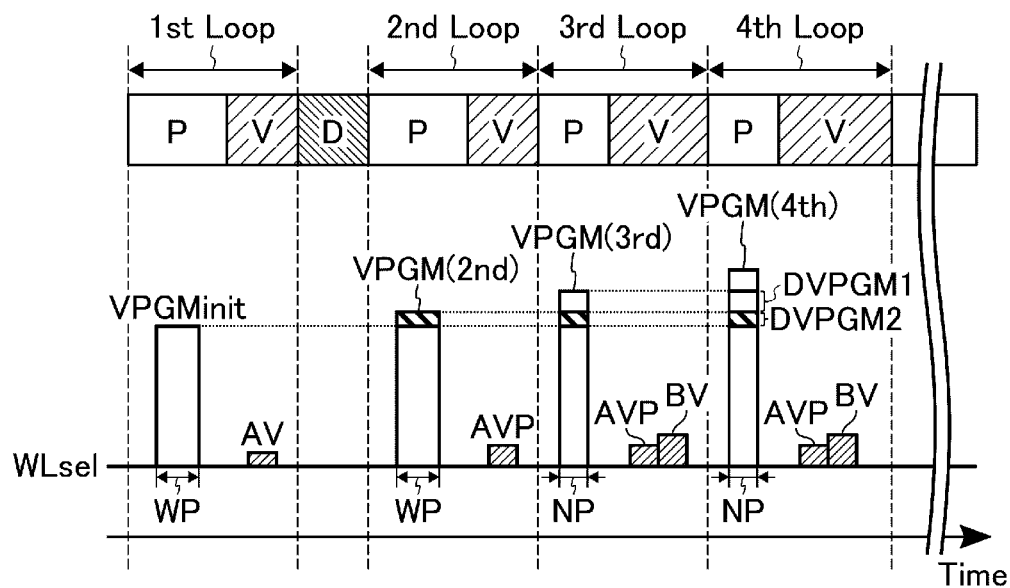
FIG. 17 is a timing chart illustrating an example of processing when cell wear is high in a write operation of a semiconductor storage device according to a second modification example.

FIG. 17 is an example of processing when a cell wear is high in a write operation of a semiconductor storage device 1 according to a second modification example and illustrates voltages applied to the word line WLsel in the first to fourth program loops. As illustrated in FIG. 17, the write operation according to the second modification example differs from the write operation illustrated in FIG. 12 in processing a program operation in the first and second program loops.

Specifically, in the second modification example, when the processing of steps S14 and S15 is performed, a program voltage (wide pulse) of which pulse width is WP is applied to the word line WLsel in the program operation of the first and second program loops. In the program operation of the third and subsequent program loops, a program voltage (narrow pulse) of which pulse width is NP narrower than WP is applied to the word line WLsel. That is, the program voltages of the first and second program loops are applied to the word line WLsel for a longer time than the program voltage of the third and subsequent program loops.

Furthermore, in the second modification example, the sequencer 13 can selectively use a narrow pulse and a wide pulse in the second program loop according to the result of the immediately preceding detection operation. For example, the sequencer 13 uses a program voltage with a narrow pulse when the processing of step S13 is performed and use a program voltage with the wide pulse when the processing of steps S14 and S15 is performed, in the second program loop. Other operations according to the second modification example are similar to the operation according to the first embodiment.

As described above, the semiconductor storage device 1 according to the second modification example sets the pulse width of the program voltage VPGM in the first program operation to be wider than the pulse width of the program voltage VPGM in the latter half program loop. Then, the semiconductor storage device 1 according to the second modification example changes the pulse width of the program voltage VPGM in the second program loop based on a result of the first detection operation.

As a result, the semiconductor storage device 1 according to the second modification example can reduce a write operation time during which a cell wear is low, that is, when a threshold voltage distribution is difficult to spread. Furthermore, the semiconductor storage device 1 according to the second modification example can reduce noise components of the program operation in the first and second program loops when the cell wear is high. Therefore, in the semiconductor storage device 1 according to the second modification example, a threshold voltage distribution width is narrower than the width in the embodiment, and reliability of data written to the memory cell transistor MT can be increased.

4. Third Modification Example

Figure 18:
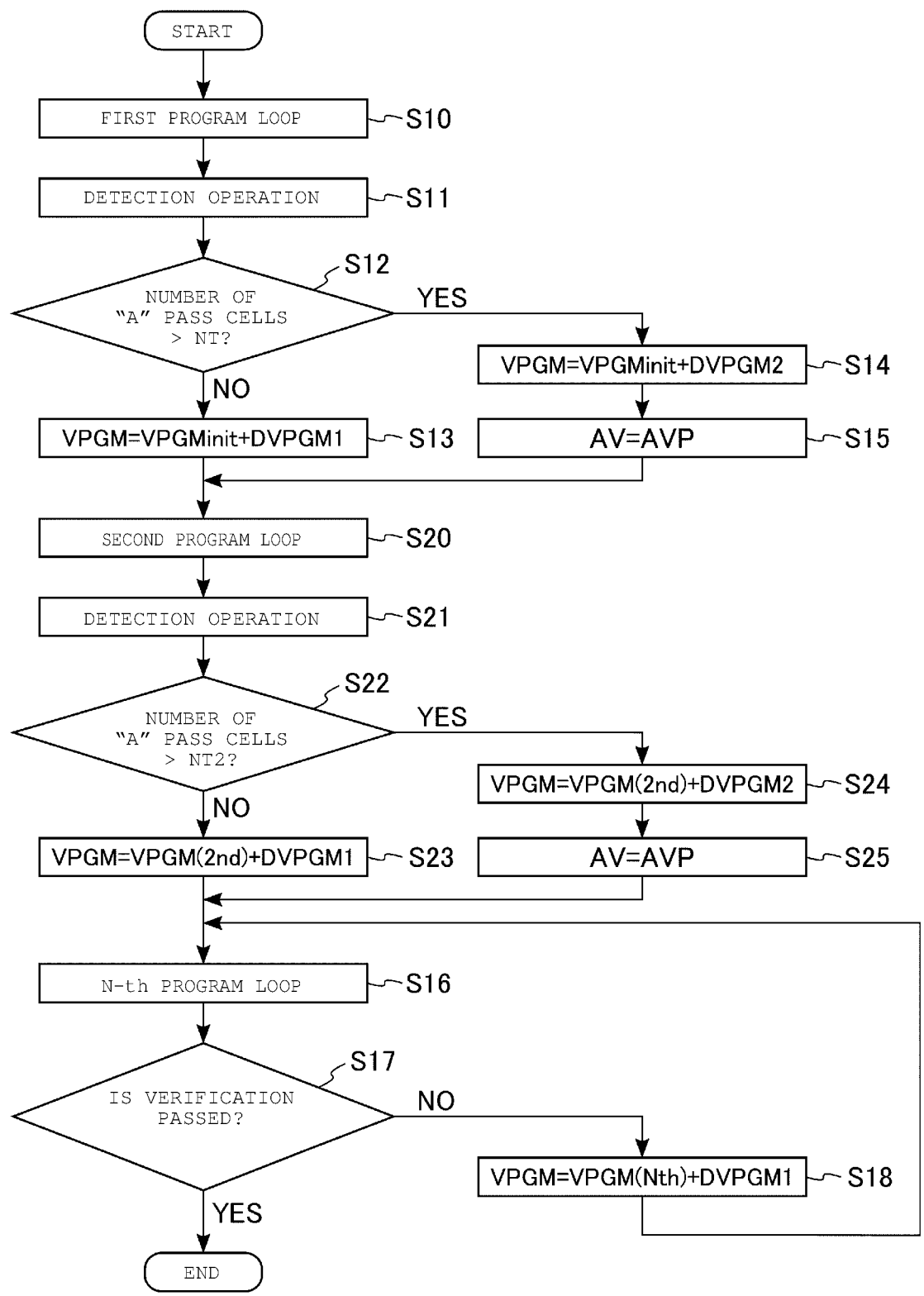
FIG. 18 is a flowchart for a write operation of a semiconductor storage device according to a third modification example.

FIG. 18 illustrates an example of a flowchart of a write operation of a semiconductor storage device 1 according to a third modification example. As illustrated in FIG. 18, the write operation according to the third modification example includes the processing of the write operation illustrated in FIG. 9 and the processing of steps S20 to S25 are added before step S16.

Specifically, the sequencer 13 performs a second program loop after the processing of step S13 or S15 (step S20). Subsequently, the sequencer 13 performs a detection operation (step S21). Next, the sequencer 13 checks whether or not the number (the number of "A" pass cells) of memory cell transistors MT which passed the "A" verification exceeds a predetermined threshold NT2, based on a result of the detection operation (step S22).

When the number of "A" pass cells is less than or equal to the threshold NT2 (step S22, NO), the sequencer 13 performs processing of VPGM=VPGM+DVPGM1 (step S23). When the number of "A" pass cells exceeds the threshold NT2 (step S22, YES), the sequencer 13 performs processing of VPGM=VPGM+DVPGM2 (step S24) and processing of AV=AVP (step S25). After the processing of step S23 or S25, the sequencer 13 proceeds to the processing of step S16, that is, processing of the next program loop.

In the third modification example, the processing of steps S20 to S25 is similar to the processing of steps S10 to S15, respectively. The predetermined threshold NT used in step S12 and the predetermined threshold NT2 used in step S22 may be equal to each other or may be different from each other. When the thresholds NT and NT2 are set to different numerical values, it is preferable to make NT2 larger than NT. By setting the threshold to be high, a count number can be reduced, and a detection operation time can be reduced.

Figure 19:
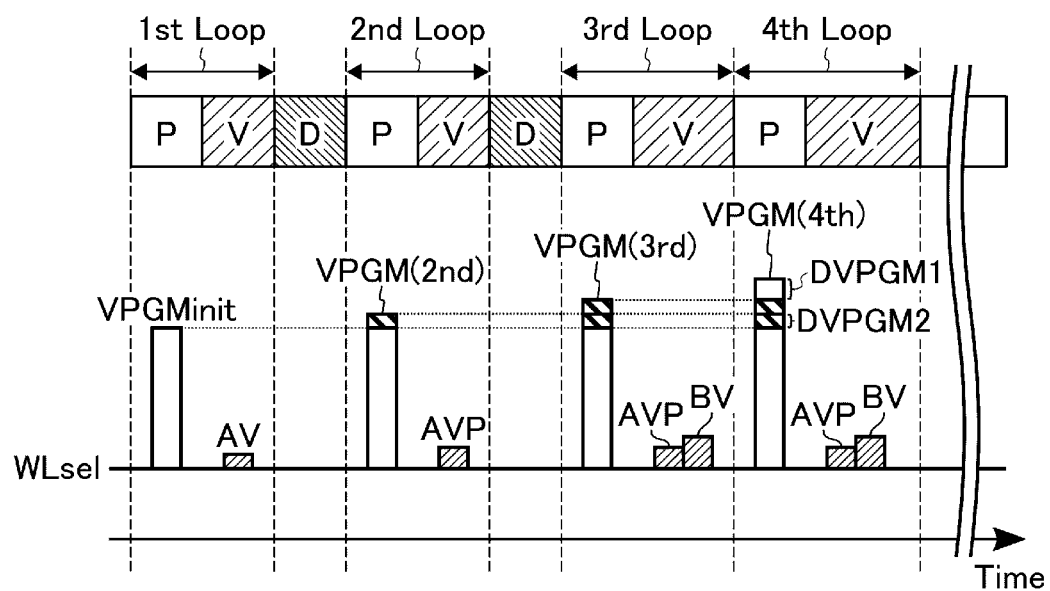
FIG. 19 is a timing chart illustrating an example of processing when cell wear is high in a write operation of a semiconductor storage device according to a third modification example.

FIG. 19 is an example of processing when the cell wear is high in the write operation of the semiconductor storage device 1 according to the third modification example and illustrates voltages applied to the word line WLsel in the first to fourth program loops. As illustrated in FIG. 19, the write operation according to the third modification example differs from the write operation according to the embodiment illustrated in FIG. 12 in inserting a detection operation after the second program loop and in a value of a program voltage in the third and subsequent program loops.

Specifically, in the third program loop ("3rd Loop"), VPGMinit+DVPGM2×2 is applied to the word line WLsel. In the fourth program loop ("4th Loop"), VPGMinit+DVPGM2×2+DVPGM1 is applied to the word line WLsel. Thereafter, the sequencer 13 appropriately performs a program loop including a program operation in which the program voltage is stepped up by DVPGM1 and a verification operation according to a progress of the write operation. Other operations according to the third modification example are similar to the operation according to the first embodiment.

The semiconductor storage device 1 according to the third modification example performs a determination operation performed in the first program loop and processing based on the determination operation even in the second program loop. The determination operation performed in the first program loop and the processing based on the determination operation may be applied to the third program loop. That is, the sequencer 13 may perform the processing corresponding to steps S12 to S15 in a program loop of a predetermined number of times after the write operation starts.

As a result, the semiconductor storage device 1 according to the third modification example can prevent occurrence of overwriting that may occur when the Vth shift increases in the second and subsequent program loops. Therefore, the semiconductor storage device 1 according to the third modification example can prevent spread of a threshold voltage distribution width more than the spread in the embodiment and can increase reliability of write data when a cell wear is high.

5. Fourth Modification Example

Figure 20:
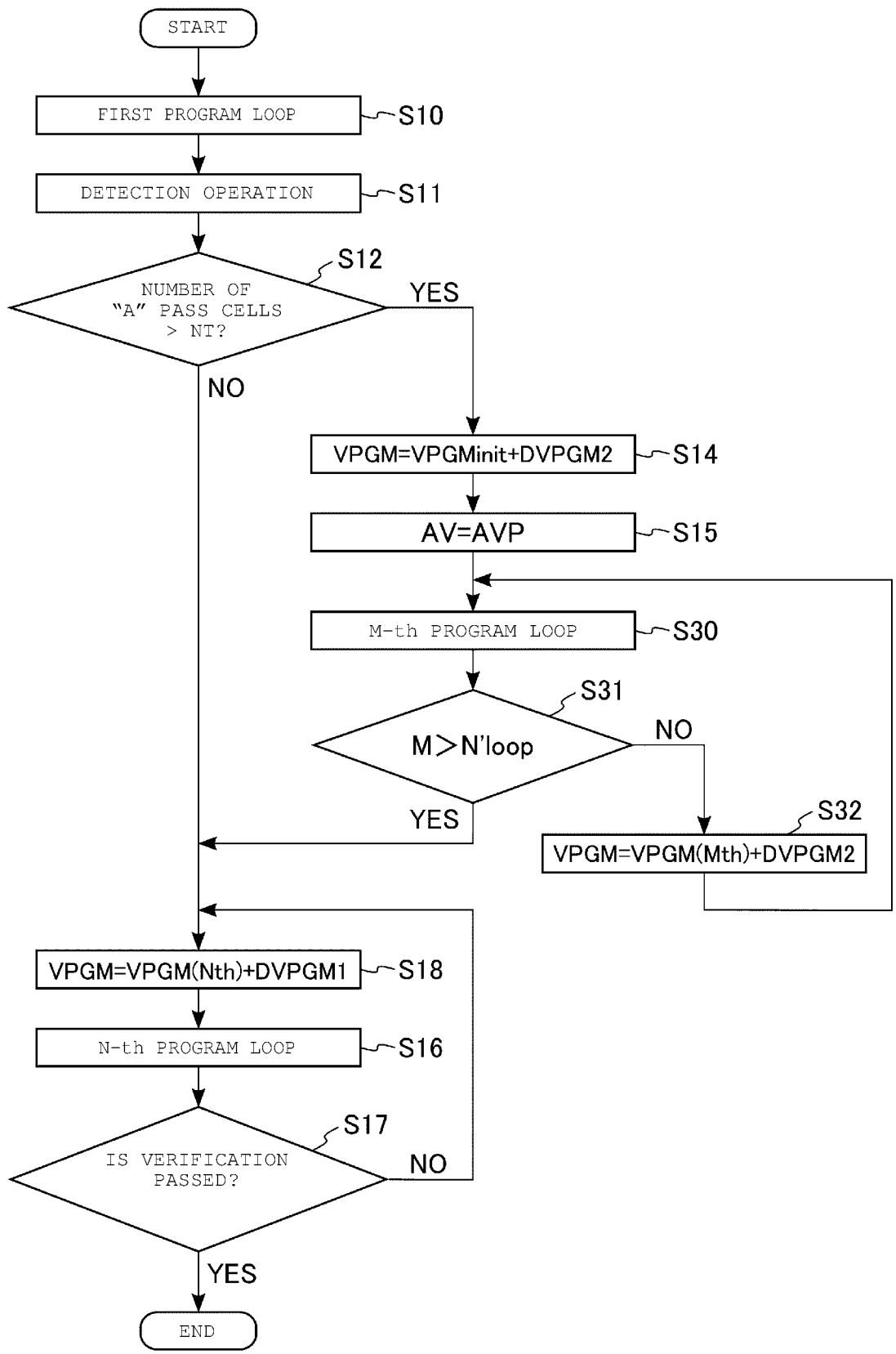
FIG. 20 is a flowchart for a write operation of a semiconductor storage device according to a fourth modification example.

FIG. 20 illustrates an example of a flowchart of a write operation of a semiconductor storage device 1 according to a fourth modification example. As illustrated in FIG. 20, the write operation according to the fourth modification example includes the processing of the write operation illustrated in FIG. 9 and the processing of steps S30 to S32 are added after step S15.

Specifically, the sequencer 13 performs an M-th (where M is an integer of 2 or more) program loop after the processing of step S15 (step S30). Next, the sequencer 13 checks whether or not the number of processed program loops exceeds a predetermined threshold N'loop. That is, the sequencer 13 confirms whether or not M>N'loop is satisfied (step S31).

When M>N' loop is not satisfied (step S31, NO), the sequencer 13 performs processing of VPGM=VPGM (M-th)+DVPGM2 (step S32) and returns to the processing of step S30. When M>N'loop is satisfied (step S31, YES), the sequencer 13 performs processing of VPGM=VPGM (N-th)+DVPGM1 (step S18) and proceeds to the processing of step S16, that is, processing of the next program loop.

In FIG. 20, the processing of step S13 is omitted. Instead, when the number of "A" pass cells is less than or equal to the predetermined threshold NT (step S12, NO), the sequencer 13 performs processing of VPGM=VPGM (N-th)+DVPGM1 (step S18) and proceeds to the processing of step S16, that is, processing of the next program loop.

Figure 21:
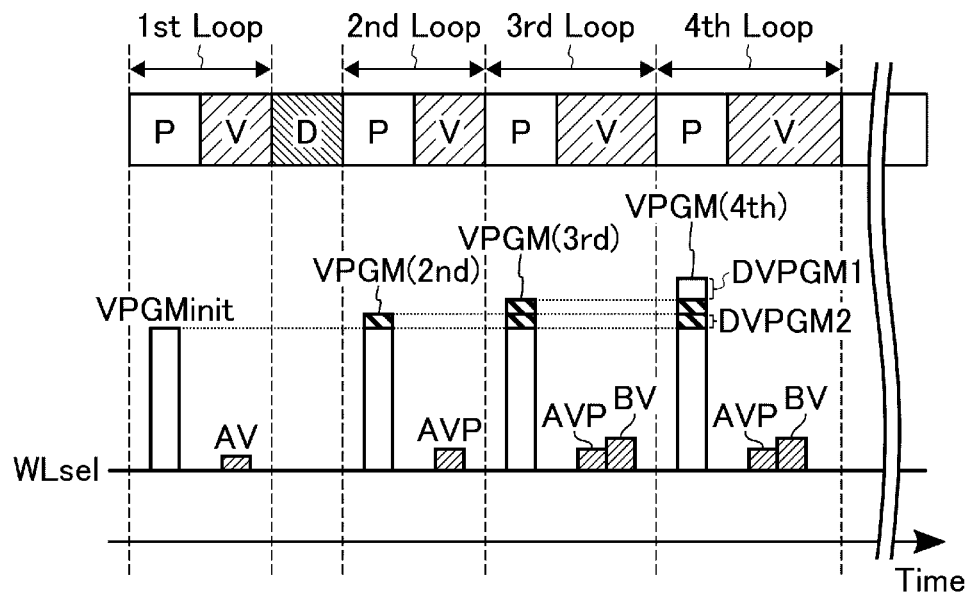
FIG. 21 is a timing chart illustrating an example of processing when cell wear is high in a write operation of a semiconductor storage device according to a fourth modification example.

FIG. 21 is an example of processing when the cell wear is high in the write operation of the semiconductor storage device 1 according to the fourth modification example and illustrates voltages applied to the word line WLsel in the first to fourth program loops. As illustrated in FIG. 21, the write operation according to the fourth modification example differs from the write operation according to the third modification example illustrated in FIG. 19 in performing processing in which the detection operation inserted after the second program loop is omitted. Other operations according to the fourth modification example are similar to the operation according to the third modification example.

As described above, the semiconductor storage device 1 according to the fourth modification example performs the same operation as in the third modification example, based only on the result of the determination operation performed in the first program loop. That is, in the semiconductor storage device 1 according to the fourth modification example can perform the program loop using the step-up voltage DVPGM2 in a program loop of a predetermined number of times after the write operation starts, when the cell wear is high.

As a result, the semiconductor storage device 1 according to the fourth modification example can prevent occurrence of overwriting and prevent spread of a threshold voltage distribution width, as in the third modification example. Therefore, the semiconductor storage device 1 according to the fourth modification example can increase reliability of write data when a cell wear is high. Further, a write time in the fourth modification example can be reduced more than the write time in the third modification example because a second detection operation is omitted.

In the fourth modification example, a case where transition of a step-up voltage is made from DVPGM2 to DVPGM1 when the cell wear is high is illustrated and the modification example is not limited thereto. For example, the sequencer 13 may set a step-up amount of a program voltage in each program loop to DVPGM2 until a write operation is completed based on detection of the fact that the cell wear is high. Thereby, the semiconductor storage device 1 can prevent spread of an upper end range of a threshold voltage distribution of states higher than the "A" state.

6. Fifth Modification Example

Figure 22:
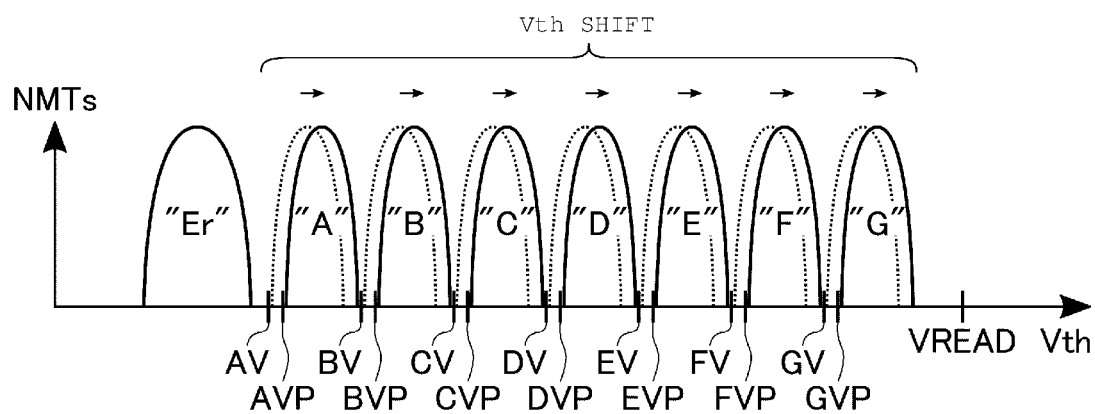
FIG. 22 is a schematic diagram illustrating aspects of a verification voltage when cell wear is high in a write operation of a semiconductor storage device according to a first embodiment.

FIG. 22 illustrates an example of a verification voltage when a cell wear is high in a write operation of a semiconductor storage device 1 according to a fifth modification example. As illustrated in FIG. 22, in the semiconductor storage device 1 according to the fifth modification example, other verification voltages are shifted according to use of the verification voltage AVP.

Specifically, in the processing of step S15 described in the first embodiment, verification voltages in the "A" state, the "B" state, the "C" state, the "D" state, the "E" state, the "F" state, and the "G" state are set to the verification voltages AVP, BVP, CVP, DVP, EVP, FVP, and GVP, respectively. The verification voltages AVP, BVP, CVP, DVP, EVP, FVP, and GVP are higher than the verification voltages AV, BV, CV, DV, EV, FV, and GV, respectively.

In the semiconductor storage device 1 according to the fifth modification example, all the threshold voltage distributions of the "A" to "G" states are shifted in a positive direction when cell wear is high. That is, the semiconductor storage device 1 according to the fifth modification example changes the verification voltage of the state having the higher threshold voltage in consideration of the spread of the upper end range caused by the high cell wear. As a result, the semiconductor storage device 1 according to the fifth modification example can reduce distribution overlap between adjacent states as compared with the first embodiment.

In the fifth modification example, a state in which the verification voltage changes when the cell wear is high may be one state or a plurality of states. Any state can be selected as the state in which the verification voltage changes. Furthermore, in the semiconductor storage device 1 according to the fifth modification example, it is preferable that the read voltages AR to GR are also shifted along with the shift of the threshold voltage distribution. Thereby, the semiconductor storage device 1 according to the fifth modification example can minimize occurrence of a read error.

7. Other Modification Examples and Variations

The first embodiment illustrates a case where processing of a write operation is changed based on a wear state of a memory cell, but is not limited thereto. A threshold voltage of the memory cell transistor MT may change depending on sensitivity to a program voltage without necessarily depending on cell wear. For example, characteristics of the memory cell transistor MT may change depending on a formation position thereof (physical position in the array). Therefore, a memory cell transistor MT for which threshold voltage easily increases and the memory cell transistor MT for which threshold voltage hardly increases can coexist in the memory cell array 10. The operation described in the first embodiment and each modification example may be applied to the memory cell transistors MT having different write characteristics or the memory cell transistors MT having write characteristics which have changed over time or with use.

The first embodiment illustrates a case where the sequencer 13 performs various operations, but is not limited thereto. The processing of the sequencer 13 described in the first embodiment (or otherwise) may be performed by other circuits. For example, the semiconductor storage device 1 may include a counter, and the counter may count the number of memory cell transistors MT which passed verification.

The above-described modification examples may be combined with each other. For example, the first modification example may be combined with any of the second to fifth modification examples. The second modification example may be combined with any of the third to fifth modification examples. The third modification example may be combined with the fifth modification example. The fourth modification example may be combined with the fifth modification example. Three or more modification examples may also be combined with each other. The semiconductor storage device 1 can obtain the respective effects of the combined modification examples by combining the respective modification examples.

The timing charts used in the present disclosure to describe a write operation according are merely examples. For example, timings of controlling a voltage of a signal and a voltage of a wire at each time may be different. Likewise, the flowcharts used to describe the write operations are merely examples. An order of processing may be changed in some examples. For example, the order of step S14 and step S15 may be exchanged. Furthermore, voltages applied to various wires in the memory cell array 10 may be estimated based on voltages of signal lines between the driver module 14 and the row decoder module 15. For example, a voltage applied to the word line WLsel can be estimated based on a voltage of the signal line CG.

In the present specification, a voltage of an "H" level is a voltage by which an N-type MOS transistor having a gate to which such voltage is applied will be turned on and a P-type MOS transistor having a gate to which such voltage is applied will be turned off. A voltage of an "L" level turns off a N-type MOS transistor and turns on a P-type MOS transistor. "One terminal of a transistor" refers to a drain or a source of a MOS transistor. "The other terminal of the transistor" refers to the other of the source or the drain of the MOS transistor.

In the present specification, "connection" refers to an electrical connection, and does not exclude electrical connections being made through or via another element interposed therebetween. An "off state" indicates that a voltage lower than a threshold voltage of a transistor is applied to a gate of the corresponding transistor, but does not exclude a flow of small leak current through the transistor.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
   a plurality of memory cells; and
   a controller configured to perform a write operation on the plurality of memory cells, the write operation including a plurality of program loops, each program loop including a program operation and a verification operation, wherein
   the controller is further configured to:
      after a first program loop in which the controller applies a first program voltage to the plurality of memory cells in the program operation and a first verification voltage for verifying that a particular number of the plurality of memory cells are in a first state to the plurality of memory cells in the verification operation:
      perform a detection operation to count the number of memory cells in the plurality of memory cells with a threshold voltage above a first threshold value,
      determine, as a voltage value of a second program voltage to be applied in a second program loop, a first program value when the counted number of memory cells with a threshold voltage above the first threshold value is greater than a predetermined number, and a second program value when the counted number is less than or equal to the predetermined number, the first program value being less than the second program value, and
      determine, as a voltage value of a second verification voltage to be applied in the second program loop for verifying that a particular number of the plurality of memory cells are in the first state, a first verification value when the counted number of memory cells is greater than the predetermined number, and a second verification value when the counted number of memory cells is less than or equal to the predetermined number, the first verification value being greater than the second verification value, and
      in the second program loop after the detection operation, apply the second program voltage having the determined voltage value thereof to the plurality of memory cells in the program operation and the second verification voltage having the determined voltage value thereof to the plurality of memory cells in the verification operation.

2. The semiconductor storage device according to claim 1, wherein the plurality of memory cells are multi-bit memory cells.

3. The semiconductor storage device according to claim 1, wherein the first verification voltage is equal to the second verification voltage that has the first verification value.

4. The semiconductor storage device according to claim 1, wherein the first threshold value is equal to the first verification voltage.

5. The semiconductor storage device according to claim 1, wherein the first threshold value is greater than the first verification voltage.

6. The semiconductor storage device according to claim 1, wherein,
   in a third program loop of the write operation after the second program loop, the controller applies a third program voltage greater than the second program voltage to the plurality of memory cells in the program operation and a third verification voltage to the plurality of memory cells in the verification operation, when the counted number of memory cells is greater than the predetermined number, the third verification voltage has the first verification value, and when the counted number of memory cells is less than or equal to the predetermined number, the third verification voltage has the second verification value.

7. The semiconductor storage device according to claim 6, wherein, in the verification operation of the third program loop, a fourth verification voltage greater than the third verification voltage is applied to the plurality of memory cells after the third verification voltage has been applied.

8. The semiconductor storage device according to claim 1, wherein the write operation further comprises another detection operation after the second program loop to count the number of memory cells in the plurality of memory cells with a threshold voltage above the second verification voltage.

9. The semiconductor storage device according to claim 1, wherein, in third and subsequent program loops of the write operation, the program voltage in the program operation is increased from the program voltage of the previous program loop in increments equal to the difference between the first program voltage and the second program voltage with the second program value.

10. The semiconductor storage device according to claim 1, wherein, in third and subsequent program loops of the write operation, the program voltage in the program operation is applied at a write pulse width less than a write pulse width in the program operations of the first and second program loops.

11. The semiconductor storage device according to claim 1, wherein, in a third program loop of the write operation, the controller is configured to apply a third program voltage to the plurality of memory cells in the program operation, the third program voltage being increased from the second program voltage by a first amount when the counted number is less than or equal to the predetermined number and a second amount when the counted number is greater than the predetermined number, and the first amount is greater than the second amount.

12. The semiconductor storage device according to claim 1, wherein the plurality of memory cells are NAND flash memory cells.

13. A semiconductor storage device, comprising:
a plurality of memory cells; and
a controller configured to perform a write operation on the plurality of memory cells, the write operation including a first program loop, a detection operation, and a second program loop, wherein
the controller is further configured to:
  in a first program operation of the first program loop, apply a first program voltage to the plurality of memory cells, and in a first verification operation of the first program loop, apply a first verification voltage for verifying that a particular number of the plurality of memory cells are in a first state to the plurality of memory cells;
  in the detection operation after the first program loop, count the number of memory cells in the plurality of memory cells having a threshold voltage above a first threshold value; and
  in a second program operation of the second program loop after the detection operation, apply a second program voltage greater than the first program voltage to the plurality of memory cells, and in a second verification operation of the second program loop, apply a second verification voltage for verifying that a particular number of the plurality of memory cells are in the first state to the plurality of memory cells, wherein when the counted number of memory cells having a threshold voltage above the first threshold value is greater than a predetermined number, the controller determines a first program value as a voltage value of the second program voltage and a first verification value as a voltage value of the second verification voltage, and when the counted number of memory cells having a threshold voltage above the first threshold value is less than or equal to the predetermined number, the controller determines a second program value greater than the first program value as a voltage value of the second program voltage and a second verification value less than the first verification value as a voltage value of the second verification voltage.

14. The semiconductor storage device according to claim 13, wherein, when the counted number of memory cells having a threshold voltage above the first threshold value is less than or equal to the predetermined number, the second program voltage is greater than the first program voltage by a first amount, and subsequent program loops in the write operation after the second program loop have program voltages increased by the first amount from the program voltage of the previous program loop.

15. The semiconductor storage device according to claim 13, wherein the write operation further includes another detection operation after the second program loop.

16. The semiconductor storage device according to claim 15, wherein the other detection operation comprises counting the number of memory cells in the plurality of memory cells having a threshold voltage above a second threshold value that is equal to the second verification value.

17. The semiconductor storage device according to claim 13, wherein, in any subsequent program loops of the write operation after the second program loop, a respective program voltage is applied at a write pulse width less than a write pulse width in the program operations of the first and second program loops.

18. The semiconductor storage device according to claim 13, wherein the write operation further includes a third program loop in which a third program voltage is applied to the plurality of memory cells, the third program voltage being increased from the second program voltage by a first amount when the counted number is less than or equal to the predetermined number and a second amount when the counted number is greater than the predetermined number, and the first amount is greater than the second amount.

19. The semiconductor storage device according to claim 13, wherein the plurality of memory cells are NAND flash memory cells.

20. A method of writing data to a plurality of memory cells, the method comprising:
performing a write operation on a plurality of memory cells, the write operation including a first program loop, a detection operation, and a second program loop, wherein
performing the write operation includes:
  in a first program operation of the first program loop, applying a first program voltage to the plurality of memory cells, and in a first verification operation of the first program loop, applying a first verification voltage for verifying that a particular number of the plurality of memory cells are in a first state to the plurality of memory cells;

in the detection operation after the first program loop, counting the number of memory cells in the plurality of memory cells having a threshold voltage above a first threshold value; and in a second program operation of the second program loop after the detection operation, applying a second program voltage greater than the first program voltage to the plurality of memory cells, and in a second verification operation of the second program loop, applying a second verification voltage for verifying that a particular number of the plurality of memory cells are in the first state to the plurality of memory cells, wherein when the counted number of memory cells having a threshold voltage above the first threshold value is greater than a predetermined number, the second program voltage having a first program value and the second verification voltage corresponding to the first state having a first verification value are applied, and when the counted number of memory cells having a threshold voltage above the first threshold value is less than or equal to the predetermined number, the second program voltage having a second program value, greater than the first program value, and the second verification voltage having a second verification value less than the first verification value are applied.

* * * * *